(12) United States Patent
Ooishi

(10) Patent No.: US 6,845,035 B2
(45) Date of Patent: Jan. 18, 2005

(54) SEMICONDUCTOR MEMORY DEVICE

(75) Inventor: Tsukasa Ooishi, Hyogo (JP)

(73) Assignee: Renesas Technology Corp., Tokyo (JP)

( * ) Notice: Subject to any disclaimer, the term of this patent is extended or adjusted under 35 U.S.C. 154(b) by 0 days.

(21) Appl. No.: 10/678,142

(22) Filed: Oct. 6, 2003

(65) Prior Publication Data

US 2004/0114447 A1 Jun. 17, 2004

Related U.S. Application Data

(62) Division of application No. 09/985,724, filed on Nov. 6, 2001, now Pat. No. 6,646,907.

(30) Foreign Application Priority Data

Jun. 1, 2001 (JP) ......................................... 2001-166657

(51) Int. Cl.⁷ .............................................. G11C 11/24
(52) U.S. Cl. ........................ 365/149; 365/222; 365/190
(58) Field of Search .............................. 365/149, 222, 365/190

(56) References Cited

U.S. PATENT DOCUMENTS

| | | | |
|---|---|---|---|
| 4,070,653 A | 1/1978 | Rao et al. | |
| 4,203,159 A | * 5/1980 | Wanlass | 365/222 |
| 5,357,460 A | 10/1994 | Yusuki et al. | |
| 5,822,258 A | * 10/1998 | Casper | 365/149 |
| 6,066,525 A | 5/2000 | Liu et al. | |
| 6,388,934 B1 | * 5/2002 | Tobita | 365/222 |

FOREIGN PATENT DOCUMENTS

| | | |
|---|---|---|
| JP | 6-244379 | 9/1994 |
| JP | 2000-124331 | 4/2000 |

* cited by examiner

*Primary Examiner*—Huan Hoang
(74) *Attorney, Agent, or Firm*—McDermott Will & Emery LLP

(57) ABSTRACT

A semiconductor memory device uses memory cells, which have structures not increasing areas, and are arranged in a distinctive manner providing high data holding stability.

A semiconductor memory device includes memory cells formed on a main surface of a semiconductor substrate, and each having first and second transistors each having a gate electrode and impurity regions forming source/drain as well as one capacitor; and bit and word lines for controlling an operation of the memory cells, a cell plate forming an electrode of the capacitor being formed of the same layer as the gate electrode.

14 Claims, 26 Drawing Sheets

ONE-SIDE OPERATION MODE
ON STANDBY

ONE-SIDE OPERATION MODE
WORD LINE ACTIVE

COMPLEMENTARY CAPACITY OPERATION MODE
ON STANDBY

COMPLEMENTARY CAPACITY OPERATION MODE
WORD LINE ACTIVE

SEMICONDUCTOR MEMORY DEVICE

This application is a divisional of application Ser. No. 09/985,724 filed Nov. 6, 2001 now U.S Pat. No. 6,646,907.

BACKGROUND OF THE INVENTION

1. Field of the Invention

The present invention relates to a semiconductor memory device, and particularly relates to a semiconductor memory device including memory cells, which have specific or distinctive structures, as well as a semiconductor memory device having a memory cell array, which has a specific or distinctive structure.

2. Description of the Background Art

A memory cell of one-transistor and one-capacitor structure is liable to loose its information, and particularly, data at a high potential level (H-data) due to leak of electric charges stored in the capacitor. In recent years, such a method has been proposed that uses two memory cells for writing H-data and L-data (i.e., data at a lower potential than Hdata) therein, respectively. This method is devised to utilize a difference in amount of stored electric charges between the two memory cells, and thereby provide a Dynamic Random Access Memory (DRAM) performing a larger operation.

However, the above method requires two transistors and two capacitors, and therefore suffers from such a problem that areas of the memory cells are large. Accordingly, it has been desired to develop a semiconductor memory device, which does not occupy a large area, and can hold data with high stability.

SUMMARY OF THE INVENTION

An object of the invention is to provide a semiconductor memory device using memory cells, which have structures not increasing areas, and are arranged in a distinctive manner providing high data holding stability.

According to a first aspect of the invention, a semiconductor memory device includes memory cells formed on a main surface of a semiconductor substrate and each having first and second transistors each having a gate electrode and impurity regions forming source/drain as well as one capacitor, and bit and word lines for controlling an operation of the memory cells. In this semiconductor memory device, a cell plate of the capacitor is formed of the same layer as the gate electrode.

According to this structure, the memory cell can have the structure including the two transistors, which are arranged on the cell plate side and the storage node side with the one capacitor therebetween, respectively. Therefore, the memory cell having high signal holding stability can be formed by devising control. Since the memory cell employs only one capacitor, the memory cell occupies only a small area.

According to the structure described above, the cell plate and the gate electrode can be formed of the same interconnection layers. Therefore, formation of the memory cell structure including the memory cell capacitor and formation of the transistors can be performed in parallel with each other within the same manufacturing steps, and therefore, the manufacturing steps can be simplified. The "same interconnection layers" described above mean the interconnection layers arranged at the same level, having the same thickness and made of the same material. The semiconductor memory device according to the invention may be a DRAM, an ERAM and others. This is true also with respect to semiconductor memory devices, which will be described later.

In the semiconductor memory device of the first aspect, the cell plate may be in electrical communication with the impurity region of the first transistor, and may be opposed to the impurity region of the second transistor with a dielectric layer therebetween.

Owing to the above structure, the memory cell can have the capacitor arranged between the two transistors. The impurity regions described above may include an impurity region, which is enlarged and deformed as compared with an impurity region of a normal transistor for increasing the capacitance of the capacitor.

The semiconductor memory device of the first aspect may have an interconnection layer located at the same level as the bit line. The interconnection layer may have a side connected to the impurity region of the first transistor via a first plug interconnection as well as another side connected to the cell plate via a second plug interconnection.

According to this structure, an interconnection for connection between the cell plate and the first transistor can be arranged within a space between the bit lines. As a result, the interconnection layer can be simple.

The semiconductor memory device of the first aspect may include a plug interconnection overlapping, in a plan view, with a side edge of the cell plate and a side edge of the impurity region of the first transistor. A portion of the plug interconnection overlapping with the side edge of the cell plate may be in contact with the cell plate, and a portion of the plug interconnection overlapping with the impurity region of the first transistor may be in contact with the impurity region of the first transistor.

Owing to the above structure, only one plug interconnection is required for establishing the foregoing connection. Therefore, the connection between the impurity region of the first transistor and the cell plate can be achieved by an extremely simple structure. The bit line is merely required to avoid the upper end of the plug interconnection. This increases the flexibility in planar arrangement of the bit line. For example, all the bit lines can be arranged linearly. Therefore, the layout of the bit line can be simple.

The semiconductor memory device according to the first aspect may include an insulating layer at a level lower than the impurity regions of the first and second transistors for interrupting conduction between the impurity regions and its lower side.

This structure can effectively prevent leak of electric charges from the memory capacitor. The insulating layer may be formed by implanting oxygen ions. Alternatively, a substrate such as an SOI (Substrate on Insulator) provided with an insulating layer, which is located under a semiconductor layer, may be used so that the insulating layer may function as a layer for preventing leak of electric charges.

In the semiconductor memory device of the first aspect, an impurity concentration of the impurity region of the second transistor opposed to the cell plate may be higher than that of the other impurity region of the second transistor.

This structure can improve a capacity efficiency of an MOS capacity formed of the cell plate. The other impurity region described above is the impurity region spaced from the impurity region, which is opposed to the cell plate, with the channel region therebetween.

A semiconductor memory device according to a second aspect of the invention includes memory cells formed on a main surface of a semiconductor substrate and each having first and second transistors each having a gate electrode and impurity regions forming source/drain as well as one capacitor, and bit and word lines for controlling an operation of the memory cells. In this semiconductor memory device, a cell plate forming an electrode of the capacitor has a belt-like form extending along the word line, and the impurity regions of the first and second transistors are opposed to the cell plate, are continuous to each other and are located along the belt-like cell plate.

When arranging the memory cells in the array, connection is made in such a fashion that the impurity regions of the memory cells in each unit are opposed to the common cell plate. Therefore, when effecting exposure on the silicon substrate for forming the impurity regions of the memory cells, it is not necessary to space the individual impurity regions from each other, and the impurity regions can be continuous to each other. Therefore, the exposing margin can be remarkably large, and the yield can be significantly improved.

In the semiconductor memory device of the second aspect, the cell plate may be located as a layer at the same level as the gate electrode serving also as the word line.

According to this structure, the cell plate and the gate electrode can be formed of the same interconnection layer. Therefore, the memory cell including the memory cell capacitor can be formed substantially simultaneously with and thus in parallel with the cell array, and therefore, the manufacturing steps can be simplified.

A semiconductor memory device according to a third aspect of the invention includes a memory cell array formed of a plurality of memory cells arranged in rows and columns, and each provided with first and second transistors having gate electrodes and impurity regions forming sources/drains as well as one capacitor, bit lines corresponding to the plurality of columns and word lines corresponding to the plurality of rows; and a sense amplifier connected to the bit lines and used for amplifying a signal for normal access to the memory cells and refresh. In this semiconductor memory device, the first transistor is arranged as a transistor for normal access to be used for the normal access and not to be used for the refresh access. The second transistor is arranged as a transistor for refresh to be used for the refresh access and not to be used for the normal access.

According to the above structure, refreshing of the memory cell can be executed independently of the access for writing into and reading from the memory cell. Therefore, the efficiency of access to the semiconductor memory device can be improved, and the further the stability in holding signals stored in the memory cells can be improved. The "normal access" means the access for reading from and writing into the memory cell, and the "refresh access" means the access for updating or renewing the capacitor signal.

In a semiconductor memory device of the third aspect, the bit lines may be formed of an access bit line and a refresh bit line, the first transistor may be connected to the access bit line, and the second transistor may be connected to the refresh bit line.

According to the above structure, voltages applied to the access bit line and the refresh bit line can be controlled for performing the access to the memory cell and the refresh independently of each other. Therefore, the access to the memory cell and the refresh thereof can be easily performed systematically within the semiconductor memory device.

The bit lines usually form pairs each including the bit line and the complementary bit line. Therefore, the access bit lines described above are formed of a pair of an access bit line and a complementary access bit line, and the refresh bit lines described above are formed of a refresh bit line and a complementary refresh bit line.

In the semiconductor memory device of the third aspect, the word lines may be formed of an access word line and a refresh word line, the sense amplifiers may include an access sense amplifier to be activated via the access word line and a refresh sense amplifier to be activated via the refresh word line, and the access sense amplifier and the refresh sense amplifier may operate independently of each other.

According to this structure, the access sense amplifier is activated by activating the access word line. Also, the refresh sense amplifier is activated by activating the refresh word line. As a result, the refresh word line is activated to activate the refresh sense amplifier independently of the access for read and write, and thereby the memory cell can be refreshed. Accordingly, the efficiency of access to the memory cell can be increased, and the stability in data holding by the memory cell can be improved.

The semiconductor memory device of the third aspect described above may employ a background refresh system for automatically refreshing the memory cell regardless of presence and absence of a refresh signal when the access sense amplifier is operating.

Owing to this structure, the refresh can be performed with a required frequency while accessing the memory cells with a sufficiently high access efficiency, and the data holding stability can be ensured.

A semiconductor memory device according to a fourth aspect of the invention includes a memory cell array formed of a plurality of memory cells arranged in rows and columns, and each provided with first and second transistors having gate electrodes and impurity regions forming sources/drains as well as one capacitor, bit lines corresponding to the plurality of columns and word lines corresponding to the plurality of rows; and a sense amplifier connected to the bit lines and used for amplifying a signal for access to the memory cells and refresh. In this semiconductor memory device, the memory cells are paired with complementary memory cells, respectively, and the sense amplifiers are formed of a normal sense amplifier connected to the bit line coupled to the memory cell and a complementary sense amplifier connected to a complementary bit line coupled to the complementary memory cell.

According to the above structure, the memory cell and the complementary memory cell can be considered as one unit of the memory cell pair. The memory cell pair includes two capacitors, which are complementary to each other so that H-data is written in one of the capacitors when L-data is written in the other. Owing to this relationship of the pair, the data pair formed of the H-data and L-data can be held more stably than the case where the H-data is solely written.

The two bit lines are connected to the normal sense amplifier, and the two complementary bit lines are connected to the complementary sense amplifier.

In the semiconductor memory device of the fourth aspect, the word lines may be formed of a first word line connected to the memory cell and a second word line connected to the complementary memory cell.

Owing to this structure, the normal sense amplifier row and the complementary sense amplifier row can be activated by using the first and second word lines, respectively. The access to and refresh of both the paired memory cells can be performed easily. Therefore, at least one of the sense amplifier and the complementary sense amplifier can be activated by activating at least one of the first and second word lines.

In the semiconductor memory device of the fourth aspect, one of the transistors in the memory cell is arranged as a transistor for normal access, and the other transistor is arranged as a transistor for refresh. Further, one of the transistors in the complementary memory cell is arranged as a transistor for normal access, and the other is arranged as a transistor for refresh.

Owing to this structure, the semiconductor memory device, which is of the complementary capacity type and can also retain the independence between the normal access and the refresh access, can be formed by using the memory cells of the two-transistor and one-capacitor type. Therefore, the stability against noises can be further improved, and the efficiency of access to a DRAM can be improved.

The semiconductor memory device of the fourth aspect may be configured such that the bit lines are formed of an access bit line and a refresh bit line, the word lines are formed of an access word line and a refresh word line, the sense amplifiers are formed of an access sense amplifier and a refresh sense amplifier, the normal access transistor in the memory cell is connected to the access bit line, the refresh transistor in the memory cell is connected to the refresh bit line, the normal access transistor in the complementary memory cell is connected to the complementary access bit line, and the refresh transistor in the complementary memory cell is connected to the complementary refresh bit line.

Owing to the above structure, the semiconductor memory device, which is of the complementary capacity type and also retains the independence between the normal access and the refresh access, can be produced inexpensively by using the memory cells of the two-transistor and one-capacitor type without significantly modifying a conventional manufacturing system.

The semiconductor memory device of the fourth aspect may include a switching control circuit for eliminating a complementary relationship between the memory cell and the complementary memory cell, establishing an equivalent relationship between the memory cell and the complementary memory cell, and operating both the memory cells equivalently.

According to this structure, the same semiconductor memory device can be used for arbitrarily selecting the circuit of the complementary capacity and the circuit of the normal and thus non-complementary capacity. As a result, the two circuits can be selected depending on the purpose of use and circumferential device environments, and depending on whether the complementary capacity type is to be selected for placing importance on the stability of data or the non-complementary capacity type is to be selected for placing importance on the memory density.

In the semiconductor memory device of the fourth aspect, the switching control circuit may include a sense amplifier connection control circuit for eliminating the complementary relationship by changing the state of connection of the sense amplifier only to the normal bit line to the state of connection to the normal and complementary bit lines, and changing the state of connection of the complementary sense amplifier only to the complementary bit line to the state of connection to the access bit line and the complementary access bit line different from the normal bit line and the complementary bit line.

According to this structure, either of the foregoing two arrangements can be selected merely by switching the foregoing connection switch without changing the arrangement in the semiconductor memory device.

A semiconductor memory device of a fifth aspect of the invention includes a memory array provided with memory cells arranged in rows and columns, and each including at least one transistor having a gate electrode and impurity regions forming source/drain as well as one capacitor, bit lines corresponding to the plurality of columns and word lines corresponding to the plurality of rows. The semiconductor memory device includes a cell plate forming one of electrodes of the capacitor and using the impurity region as an opposite electrode, and a cell plate potential changing circuit for changing the potential on the cell plate.

This structure can compensate for lowering of the potential due to, e.g., leak of the potentials of H-data from the capacitor, and can prevent vanishing or deterioration of the stored data. The potential changing circuit may be a cell plate line driver formed of pMOS and NMOS connected to a cell plate line.

In the semiconductor memory device of the fifth aspect, it is desired that the cell plate is arranged for each of the word lines.

The above structure can provide the semiconductor memory device, which can hold the stored signals with high stability, and can be inexpensive owing to reduction in cost of photomasks and others achieved by the simplified memory array.

According to the semiconductor memory device of the fifth aspect, it is desired that the cell plate has a belt-like form extending along the word line, and the memory array is positioned along the belt-like cell plate.

For example, the memory cells of the second aspect may be used as the memory cells arranged in accordance with this fifth aspect, in which case the semiconductor memory device of the fifth aspect and the cell plate potential changing circuit can have very simple structures. Therefore, it is possible to provide the semiconductor memory device, which has good storage stability and is very inexpensive.

According to the semiconductor memory device of the fifth aspect, it is desired that the cell plate potential changing circuit is a time-varying potential changing circuit for correcting the potential on the cell plate varying with time due to leak of potentials in the capacitor.

In this structure, when the potential changes oppositely to the change causing loss of the H-data, i.e., from a low level to a high level, compensation for the H-data can be performed by the coupling effect between the cell plate and the storage node (impurity region). As a result, it is possible to compensate efficiently for the charge-leak of H-data, which occurs during intervals between refresh operations.

According to the semiconductor memory device of the fifth aspect, the cell plate potential changing circuit can reset an amount of change effected on the cell plate when accessing the memory cell.

When the refresh access or normal access is effected on the memory cell, the cell plate is set to L-level. According to the above structure, compensation for the charge-leak of the capacitor can be performed in accordance with the cycles of the above.

According to the semiconductor memory device of the fifth aspect of the invention, the cell plate potential changing circuit may change the potential on the cell plate by flowing a current through the capacitor.

For compensating for the leak of charges in the capacitor, the current can be gradually supplied from a power supply side to the capacitor so as to raise the potential on the cell plate. As a result, deterioration of the data signal in the capacitor can be prevented.

In the semiconductor memory device of any one of the foregoing third to fifth aspects, it is desired that the memory cell is formed of the memory cell of the first or second aspect.

According to the above structure, the memory cell of the two-transistor and one-capacitor type can be formed in a small region through steps prepared only by making a simple change to conventional steps of manufacturing the semiconductor memory device. In the process of manufacturing an integrated circuit of the memory array, the memory cells can be arranged at a high density without making a significant change to the conventional steps of manufacturing the semiconductor memory device. As a result, the semiconductor memory device, which has good data holding stability, has a high-density structure and exhibits high yield, can be manufactured at a low cost.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

Embodiments of the invention will now be described with reference to the drawings.

First Embodiment

Figure 1:
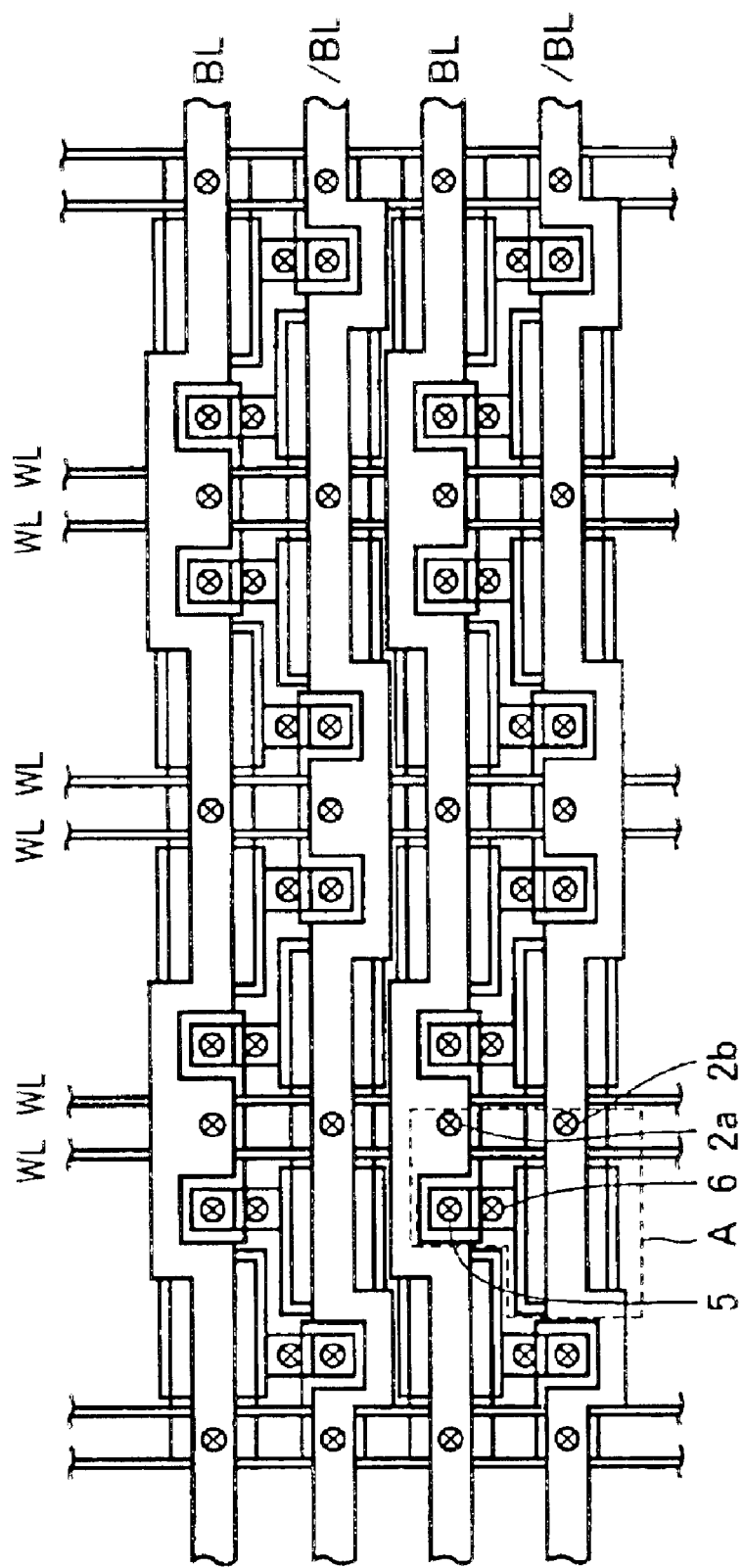
FIG. 1 is a plan showing an array of memory cells of a DRAM of a first embodiment of the invention.

FIG. 1 shows an arrangement in a DRAM of a first embodiment of the invention. In FIG. 1, a memory cell in the DRAM is formed of two transistors and one capacitor. This DRAM can be achieved by repeating an arrangement of a portion, which is the memory cell including the two transistors and the one capacitor, and is indicated by "A", by parallel translation, mirror-image mapping or point-symmetrical mapping. In FIG. 1, bit line contacts 2a and 2b are located under bit lines BL and/BL, respectively. Plug interconnections 5 and 6 form contacts for connecting the two transistors to an electrode of the capacitor.

Figure 2:
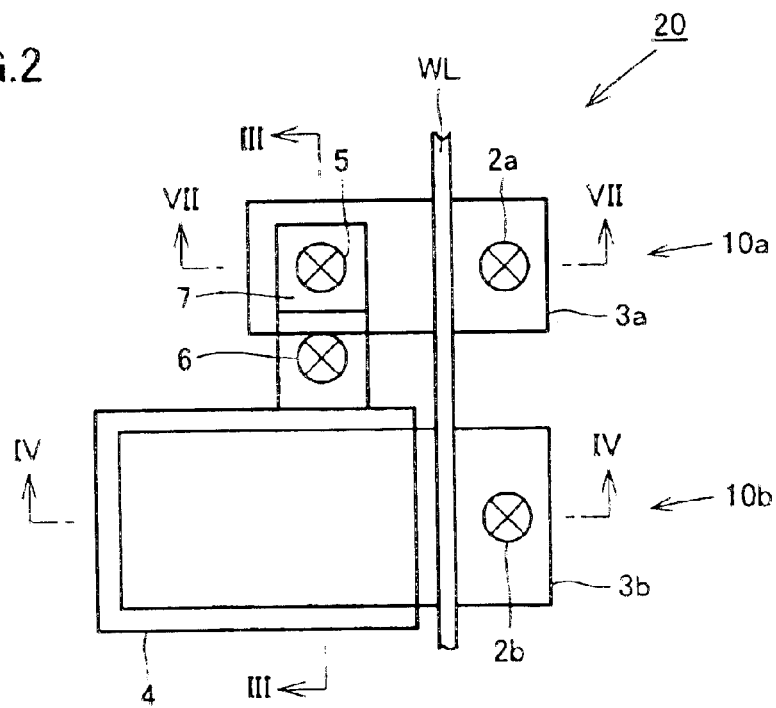
FIG. 2 shows, on an enlarged scale, a portion indicated by "A" in FIG. 1.

FIG. 2 shows, on an enlarged scale, the portion indicated by "A" in FIG. 1. In this portion, two MOS transistors 10a and 10b are arranged along a word line WL serving also as gate electrodes. MOS transistors 10a and 10b have impurity regions 3a and 3b, respectively. The capacitor which is commonly used by the two transistors is formed between a cell plate 4 and impurity region 3b of transistor 10b. Cell plate 4 is connected to transistor 10a via a plug interconnection 5 extending to one of impurity regions (source/drain regions) of transistor 10a, an upper interconnection 7 and a plug interconnection 6 extending to the cell plate. Impurity region 3b of transistor 10b is enlarged as compared with impurity region 3a of transistor 10a. The impurity regions thus enlarged and deformed is also referred to as an impurity region of the transistor.

Figure 3:
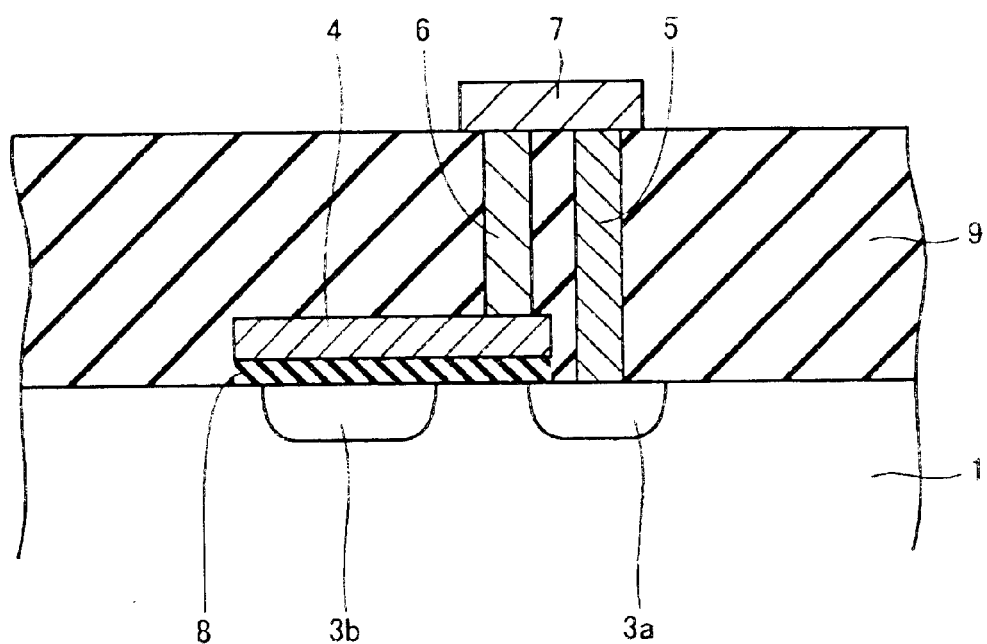
FIG. 3 is a cross section taken along line III—III in FIG. 2.

Referring to FIG. 3, a capacitor 11 has electrodes, which are formed of cell plate 4 and impurity region 3b of transistor 10b, respectively, and are located on the opposite sides of a dielectric layer 8. In a sense of the electrode opposed to cell plate 4, impurity region 3b of transistor 10b may be referred to as a storage node. The dielectric layer between cell plate 4 and storage node 3b may be made of the same material as an interlayer insulating film 9. Cell plate 4 is connected to impurity region 3a of the other transistor 10a via plug interconnection 5, a strap 7 and plug interconnection 6.

Impurity region 3b is a portion forming the storage node, and is doped with impurities more heavily than other portions. Thereby, a capacity efficiency of the capacitor, which is formed between it and the cell plate, can be improved.

Figure 4:
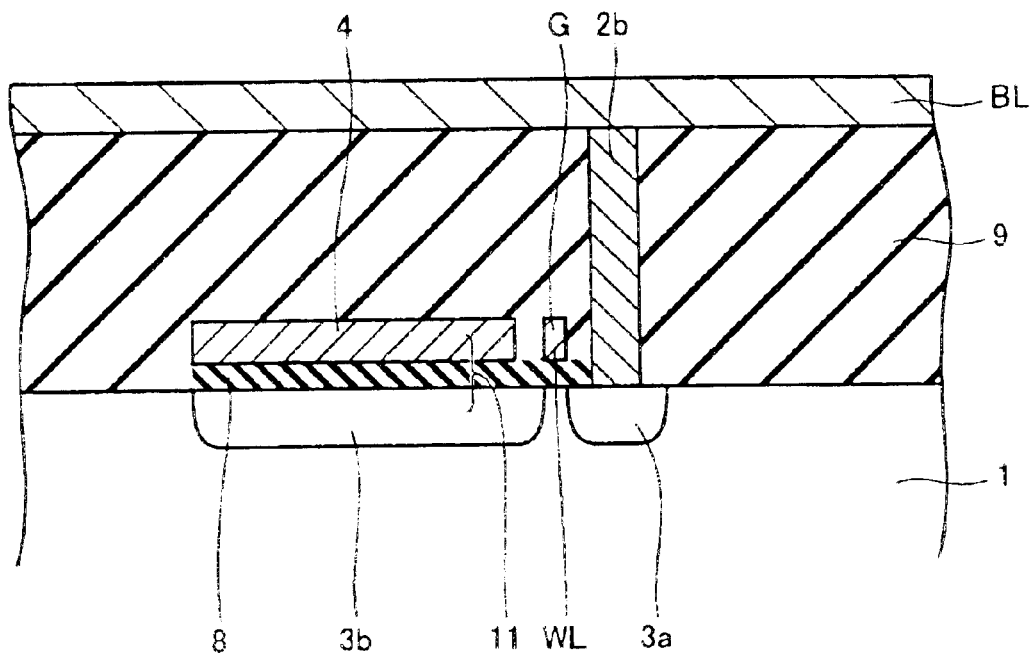
FIG. 4 is a cross section taken along line IV—IV in FIG. 2.

As can be seen from FIG. 4, cell plate 4 is formed of a layer located at the same level as word line WL serving also as the gate electrode. Thus, cell plate 4 is formed of the layer at the same level as the gate electrode, whereby the step of forming the capacitor can be performed simultaneously with the step of forming the gate electrode so that the steps can be simplified.

Figure 5:
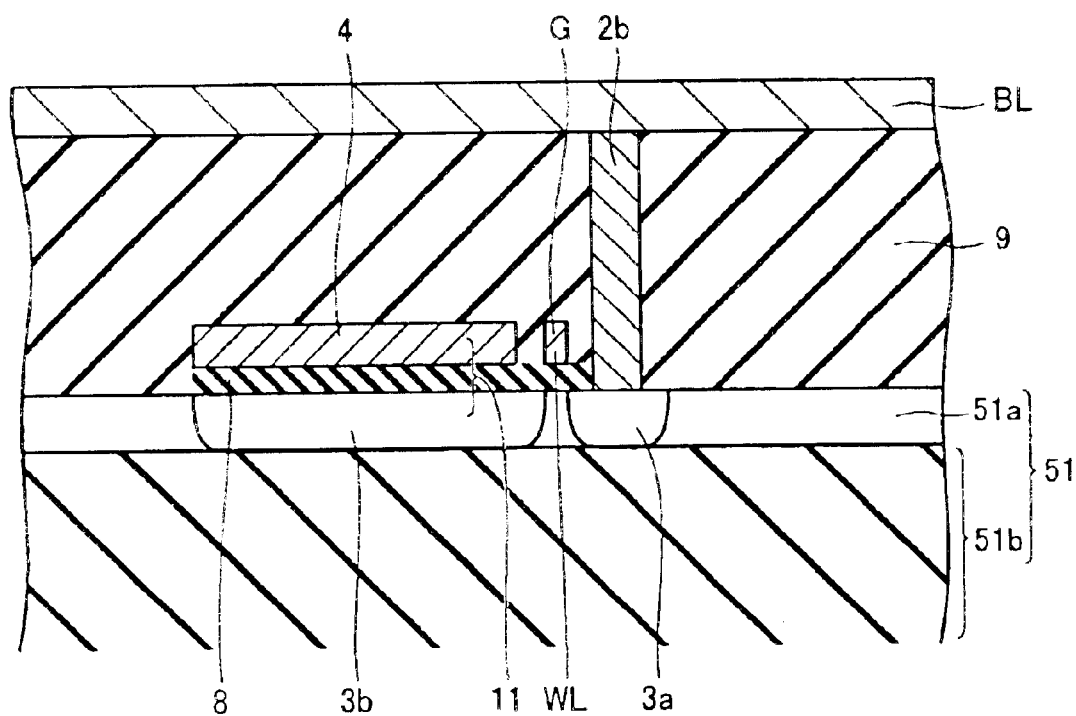
FIG. 5 is a cross section corresponding to FIG. 3, and shows a structure of the memory cell in the DRAM of the first embodiment of the invention including an impurity region of a storage node surrounded by an insulating layer within a semiconductor substrate.
Figure 6:
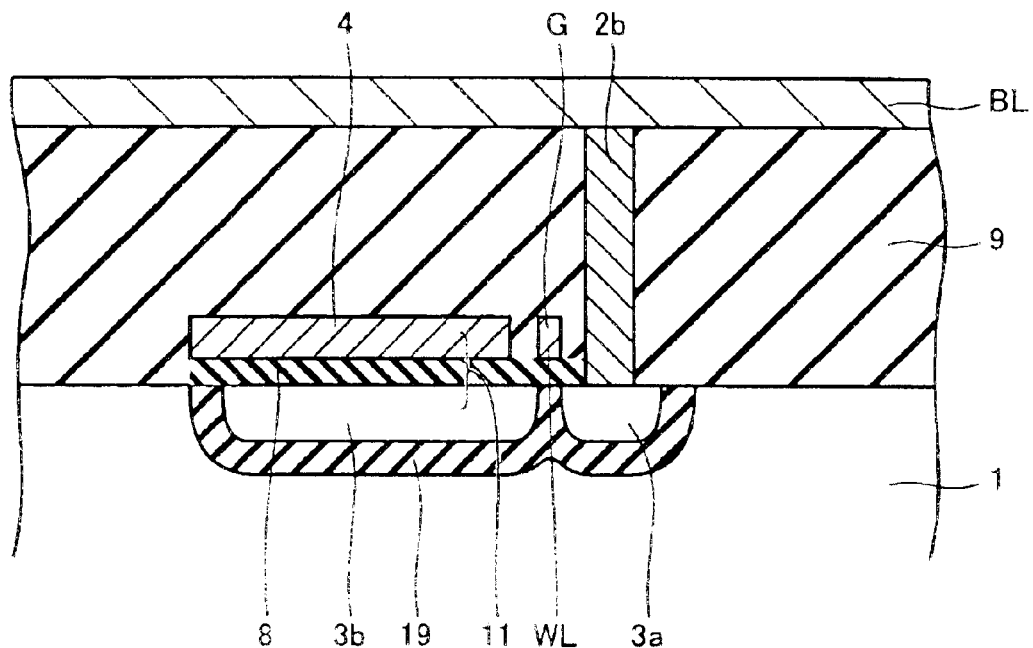
FIG. 6 is a cross section corresponding to FIG. 4, and shows a structure of the memory cell in the DRAM of the first embodiment of the invention including the impurity region of the storage node surrounded by the insulating layer within the semiconductor substrate.

As can be seen from FIGS. 5 and 6, it is desired to arrange an insulating layer for preventing leak of charges from the pn junction, which is formed between the storage node and semiconductor substrate 1. In FIG. 5, an SOI (Semiconductor on Insulator) substrate is used, and thereby the impurity region is formed on a silicon film on the insulating layer so that the leak can be prevented. In FIG. 6, ions of oxygen or the like are implanted to form an insulating layer of silicon oxide or the like between impurity region 3b and semiconductor substrate 1, whereby the leak of charges can be prevented.

Figure 7:
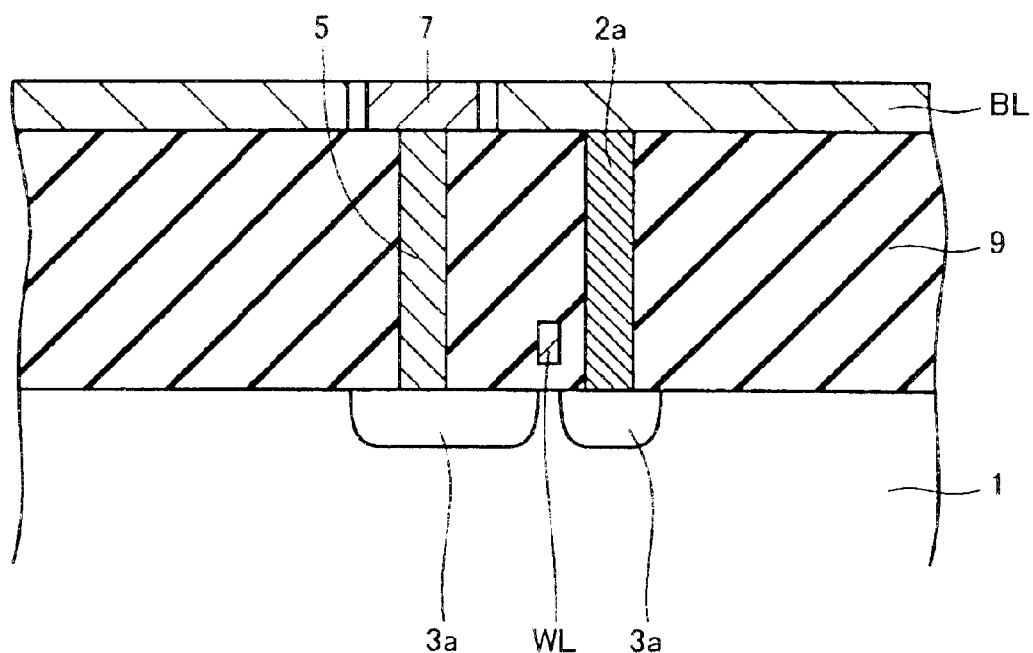
FIG. 7 is a cross section taken along line VII—VII in FIG. 2.

In a cross section of FIG. 7, there is shown a channel located under the source/drain of transistor 10a and gate electrode WL, which is formed on semiconductor substrate 1. Bit line contact 2a of the plug interconnection is provided for connecting one of impurity regions (3a) of transistor 10a to bit line BL, and is independent of the capacitor. Bit line BL is arranged around the strap 7 for preventing contact with strap 7. The structure of the bit line for avoiding strap 7 is shown in FIG. 1.

As described above, the other impurity region 3a of transistor 10a is connected to cell plate 4 via strap 7, whereby the strap can be formed of only the metal layer formed of the same layer as the bit line. Therefore, the layers of interconnections can be reduced in number.

Figure 8:
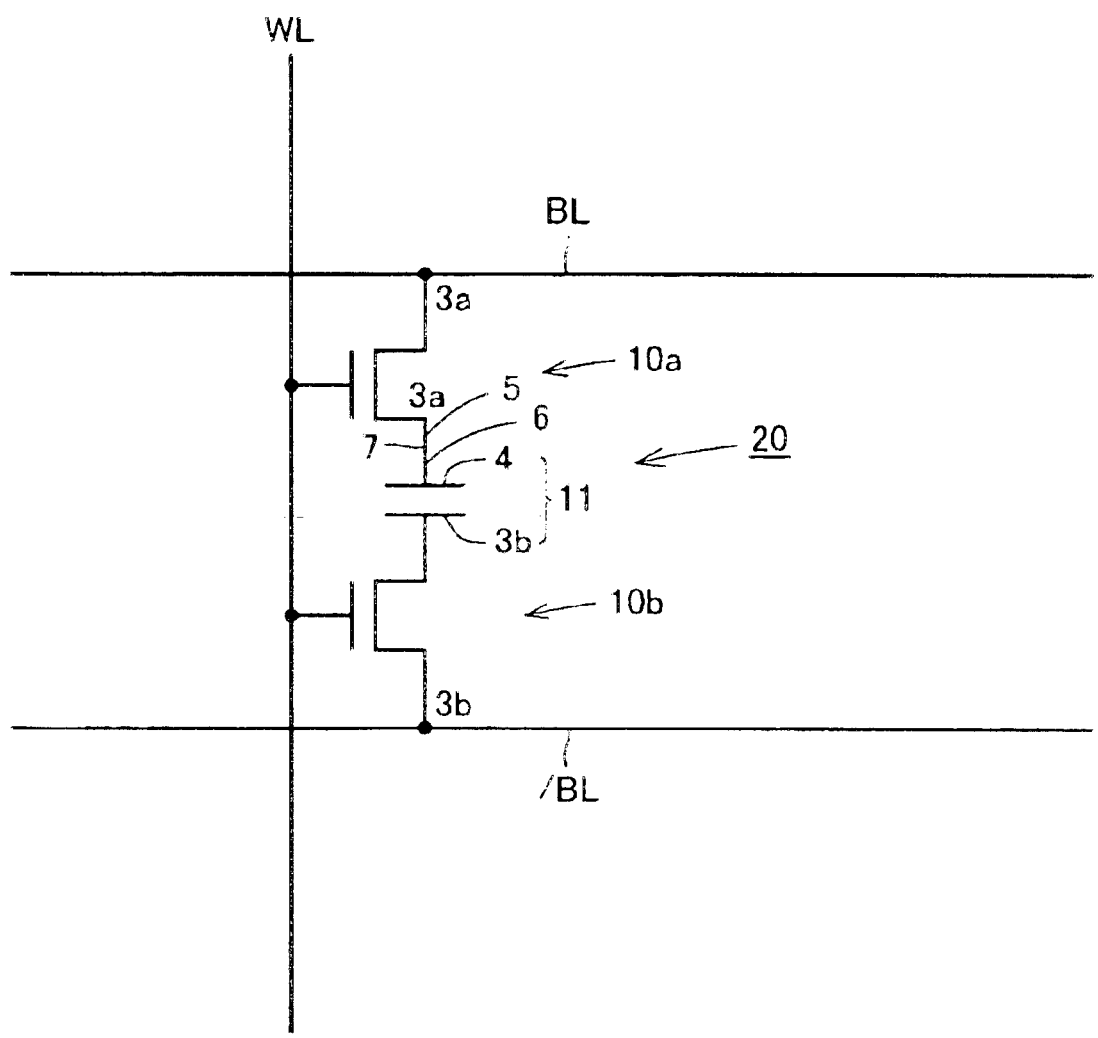
FIG. 8 is a circuit diagram of the portion indicated by "A"

The memory cell of the two-transistor and one-capacitor type shown in FIGS. 1–7 form a circuit shown in FIG. 8. In this embodiment, capacitor 11 is arranged between two transistors 10a and 10b.

Figure 9:
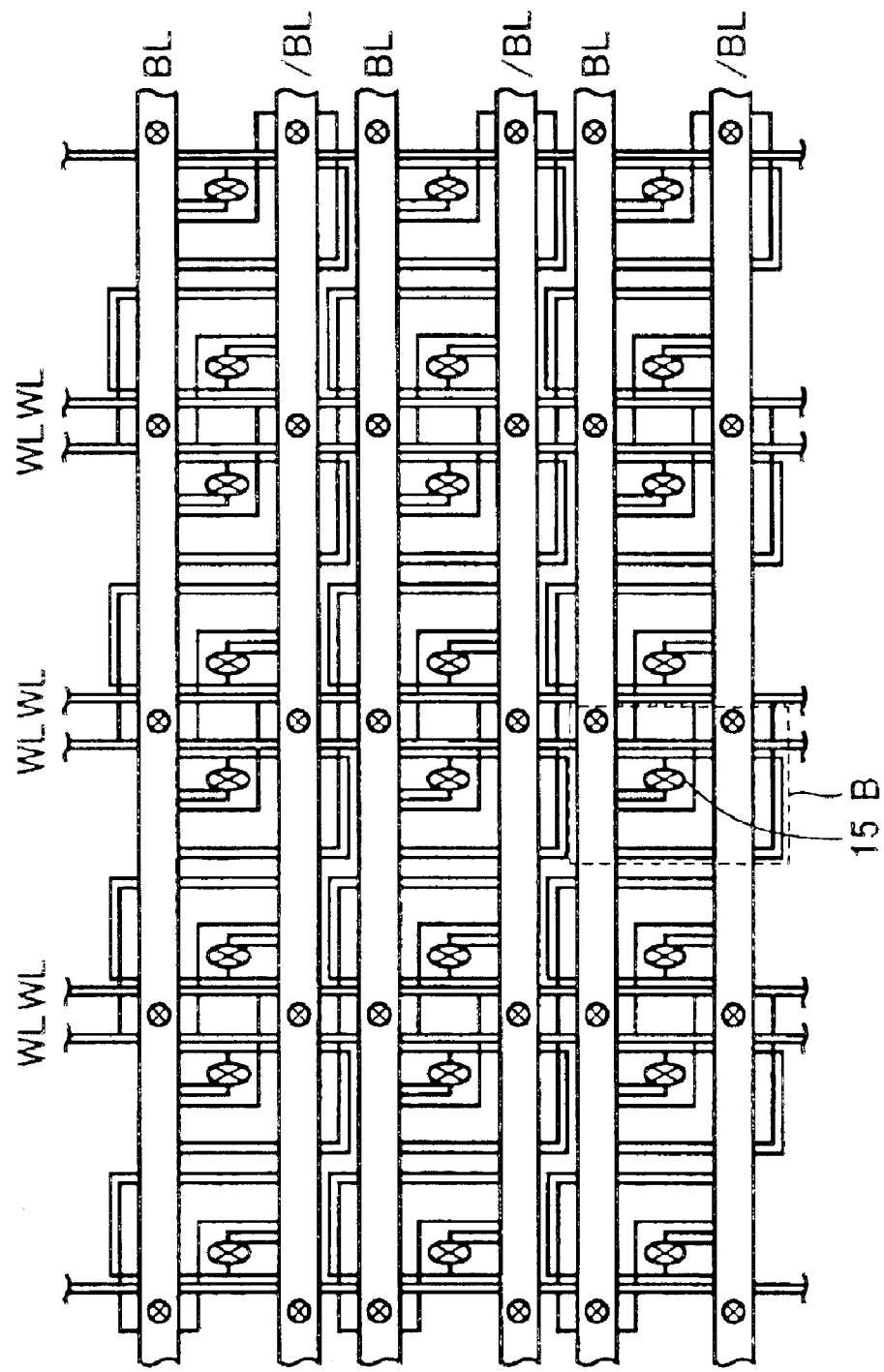
FIG. 9 is a plan of a memory cell array of another DRAM of the first embodiment of the invention.

In FIG. 9, a memory cell of the two-transistor and one-capacitor type has such a feature that the transistor and the capacitor are connected via one contact (plug interconnection). Therefore, it is necessary to use a strap arranged in the same height range as the bit line for connecting the impurity region of one of the transistors to the cell plate.

Figure 10:
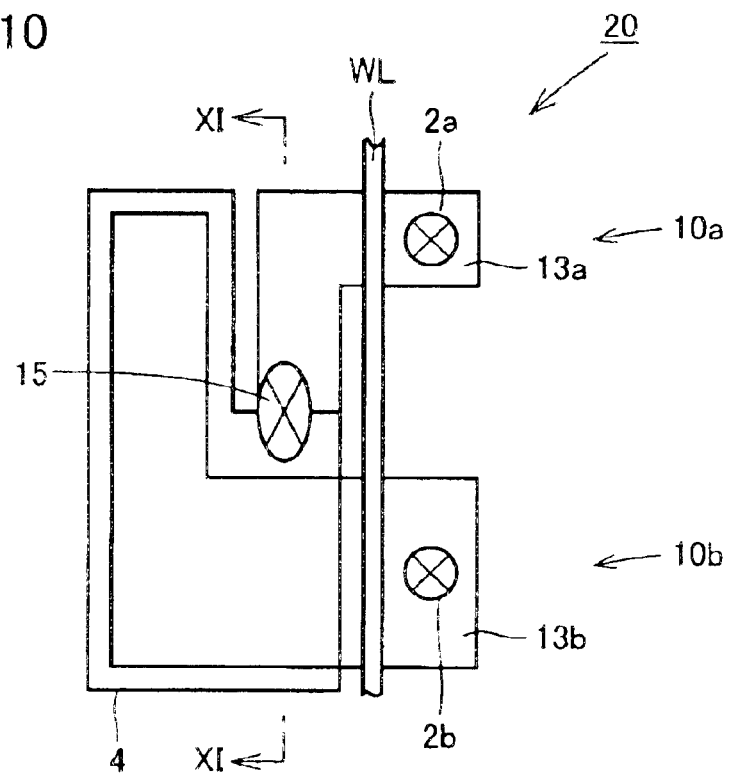
FIG. 10 shows, on an enlarged scale, a portion indicated by "B" in FIG. 9.

FIG. 10 shows, on an enlarged scale, a portion indicated by "B" in FIG. 9. In FIG. 10, two transistors 10a and 10b are arranged along word line WL serving also as the gate electrode. Each of impurity regions 13a and 13b of the two transistors has an L-shaped form. Cell plate 4 is opposed to impurity region 13b of transistor 10b. Cell plate 4 and impurity region 13b form the electrodes of capacitor, respectively.

Figure 11:
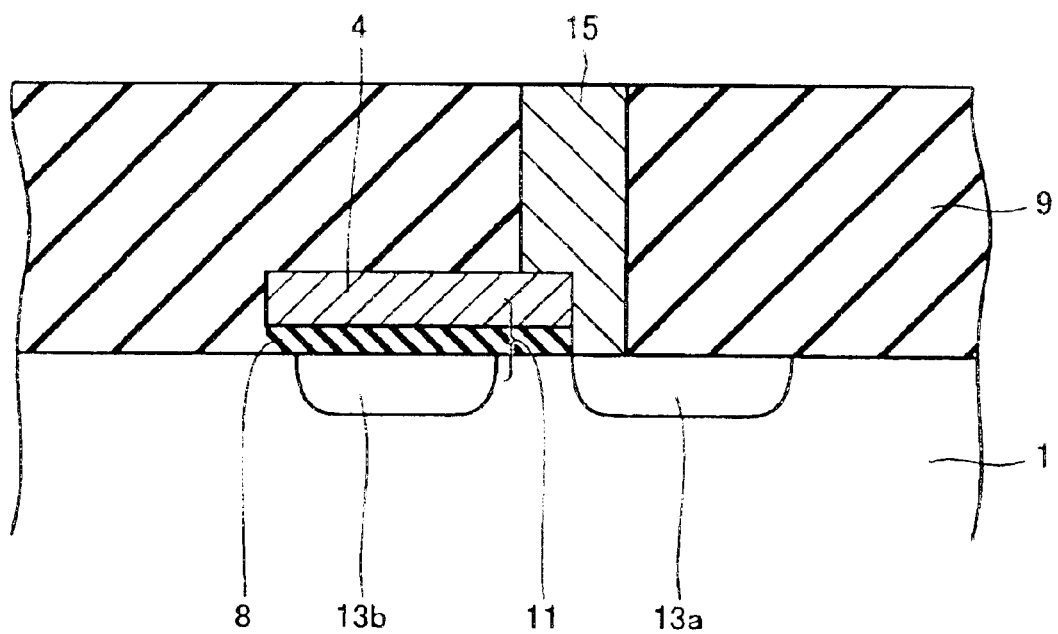
FIG. 11 is a cross section taken along line XI—XI in FIG. 10.

As can be seen from FIG. 11, one contact 15 is connected to impurity region 13a of transistor 10a as well as cell plate 4. Since contact 15 is formed of a filling portion made of an electrically conductive material such as aluminum, copper or tungsten, cell plate 4 and impurity region 13a are electrically connected together with reliability. Owing to the above structure, it is not necessary to employ a strap or the like, which is formed of the layer at the same level as the bit line, in contrast to the memory cells of the two-transistor and one-capacitor type shown in FIGS. 1–7. Since the strap at the same level as the bit line is not formed, it is not necessary to employ the bit line having an irregular form for avoiding the strap as shown in FIG. 1. Accordingly, the bit line can have a straight form as shown in FIG. 9, and the layout of the bit lines can be simple. The two transistors and one capacitor shown in FIGS. 9–11 form the same circuit as that shown in FIG. 8.

Figure 12:
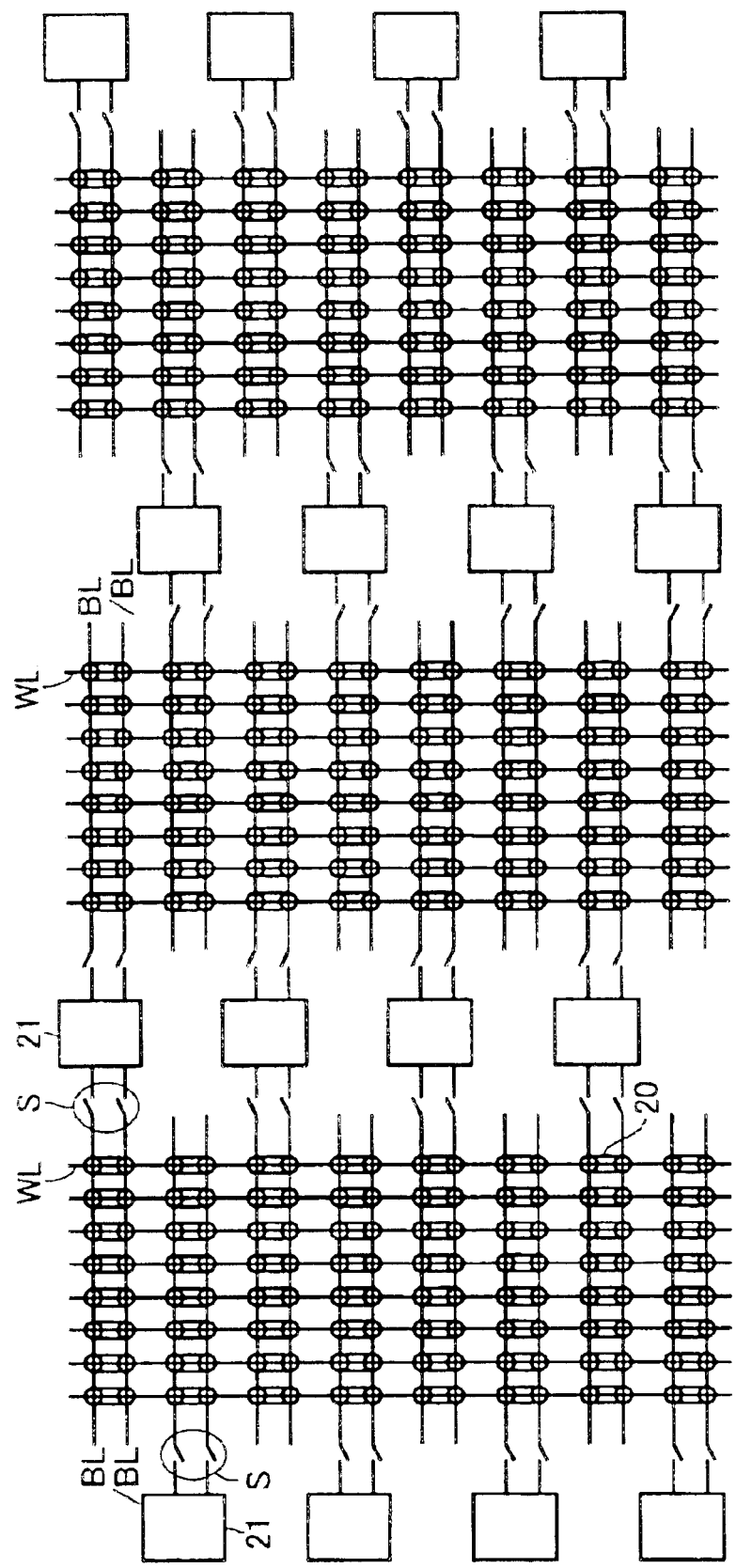
FIG. 12 shows operation environments of the memory cell array of the first embodiment of the invention.

In FIG. 12, a memory cell 20 has transistors, which are connected to bit line BL and complementary bit line /BL, respectively. Sense amplifiers 21 are arranged alternately, and are connected to memory cells 21 via bit lines BL and complementary bit lines /BL for amplification. In FIG. 12, the sense amplifiers are arranged in an alternate fashion, although not restricted thereto. A switch S is interposed between sense amplifier 21 and bit lines BL and /BL.

Figure 13:
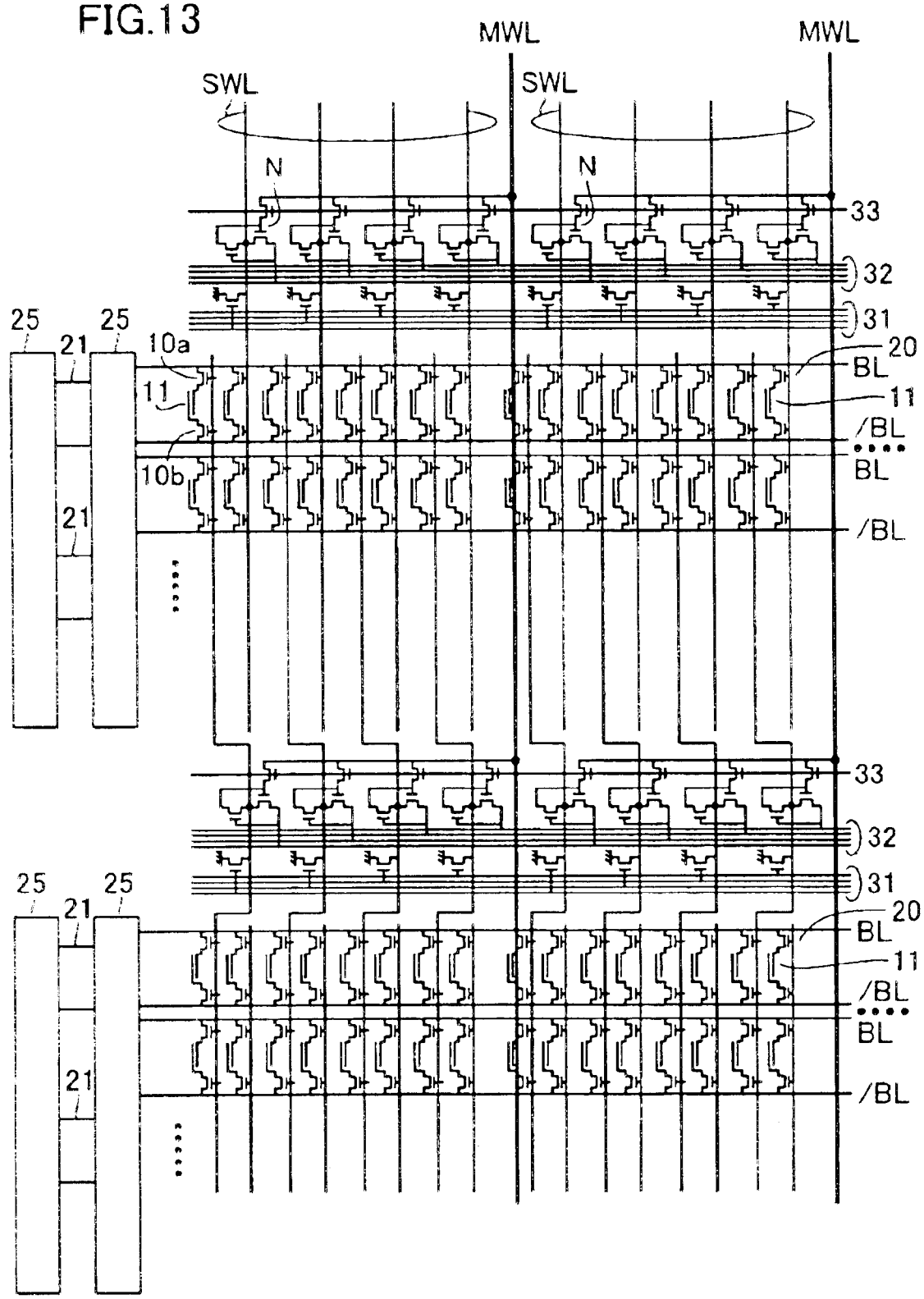
FIG. 13 is a circuit diagram showing a structure on the word line side of the memory cell array in FIG. 12.

Referring to FIG. 13, a sense amplifier connection controller (switching control circuit) 25 is interposed between bit lines BL and /BL and sense amplifier 21 for changing the connection structure between the bit lines and the sense amplifier, and thereby switching the arrangement of memory cells between the normal arrangement and, e.g., the complementary arrangement.

In FIG. 13, the word lines are formed of main word lines MWL and sub-word lines SWL, and bank select lines 33 and select lines 32, which form decoders for selecting these sub-word lines, are arranged. Reset lines 31 are also provided for resetting potentials of the capacitors when the normal access or refresh access to the memory cells is performed.

According to the above structure, the semiconductor memory device, which has the simple structure and can hold data with high stability, can be manufactured with high yield without adding a significant change to the conventional manufacturing steps.

Second Embodiment

A memory cell of a second embodiment of the invention differs from that of the first embodiment in that both the two transistors are connected only to the storage node side, and neither of them is connected to the cell plate.

Figure 14:
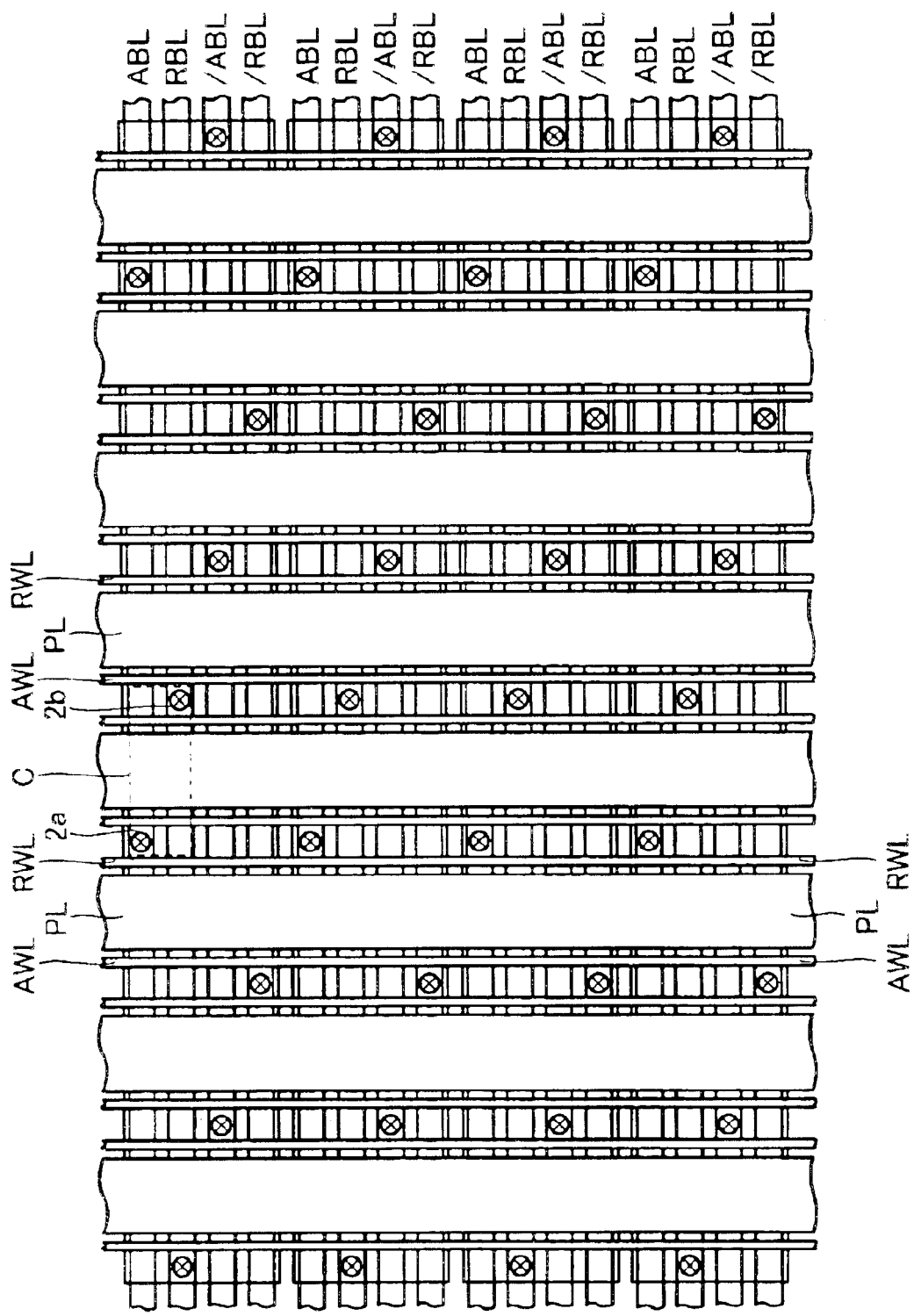
FIG. 14 is a plan showing a memory cell array of a DRAM of a second embodiment of the invention.
Figure 15:
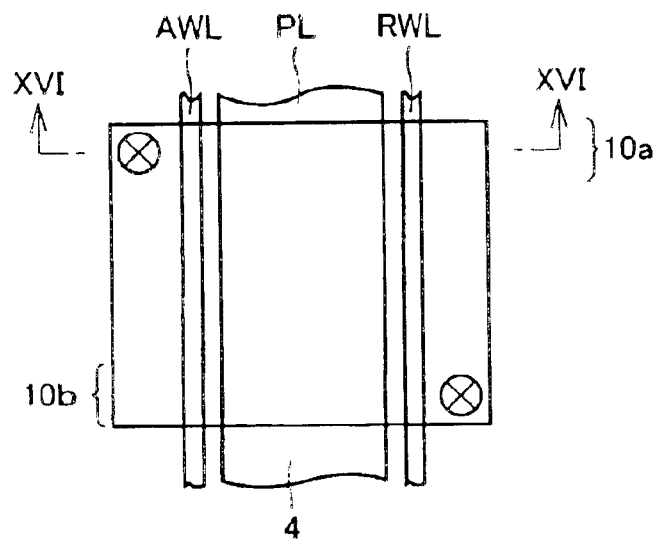
FIG. 15 shows, on an enlarged scale, a portion indicated by "C" in FIG. 14.
Figure 16:
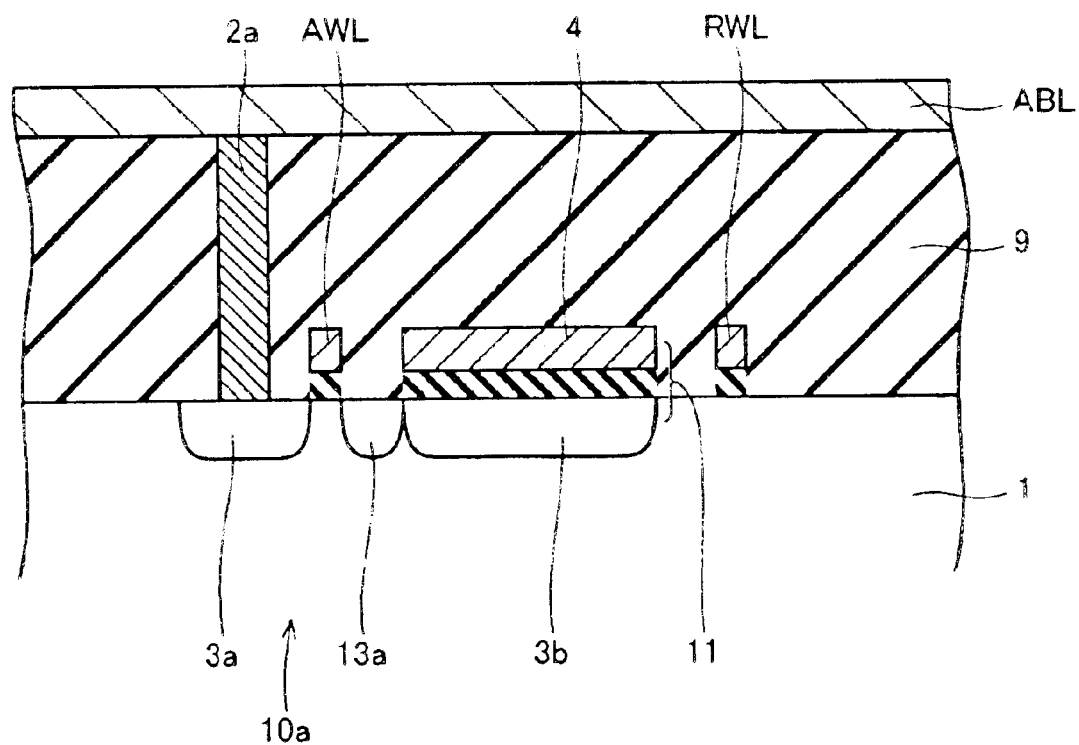
FIG. 16 is a cross section taken along line XVI—XVI in FIG. 15.

In FIG. 14, the memory cells of the two-transistor and one-capacitor type of the invention are arranged to form a storage device of the background refresh type. In the semiconductor memory device of the background refresh type, one of the two transistors forming the memory cell is utilized as the access transistor, and the other is utilized as the transistor for refresh. In the array arrangement shown in FIG. 14, the memory cells of the two-transistor and one-capacitor type are present in a portion indicated by "C", and this portion C is shown, on an enlarged scale, in FIG. 15. FIG. 16 is a cross section taken along line XVI—XVI in FIG. 15.

In FIG. 16, one transistor 10a has impurity region 3a connected to an access bit line ABL via bit line contact 2a as well as a channel region located immediately under an access word line AWL, which is the gate electrode, and the other impurity region 3b opposed to the cell plate.

Transistor 10b, which is paired with transistor 10a, includes the impurity region opposed to cell plate 4 as well as the gate electrode formed of a refresh word line RWL different from access word line AWL. Transistor 10b also has the impurity region connected to a refresh bit line RBL.

In the array formed of the memory cells described above, the impurity regions of the respective memory cells are connected together. Thus, in the exposing processing for forming the impurity regions of the memory cells on the silicon substrate, it is not necessary to form individual impurity regions independently of each other in contrast to the conventional method, and it is merely required to form two kinds of belt-like impurity regions, which have wide and narrow widths, respectively, in parallel with the word line. Therefore, the exposure margin is significantly increased and thus the yield can be improved.

The bit line structure is provided with bit lines ABL and /ABL for access as well as bit lines RBL and /RBL for refresh. Bit line contacts are arranged at positions, which are shifted slightly for corresponding to these bit lines.

Figure 17:
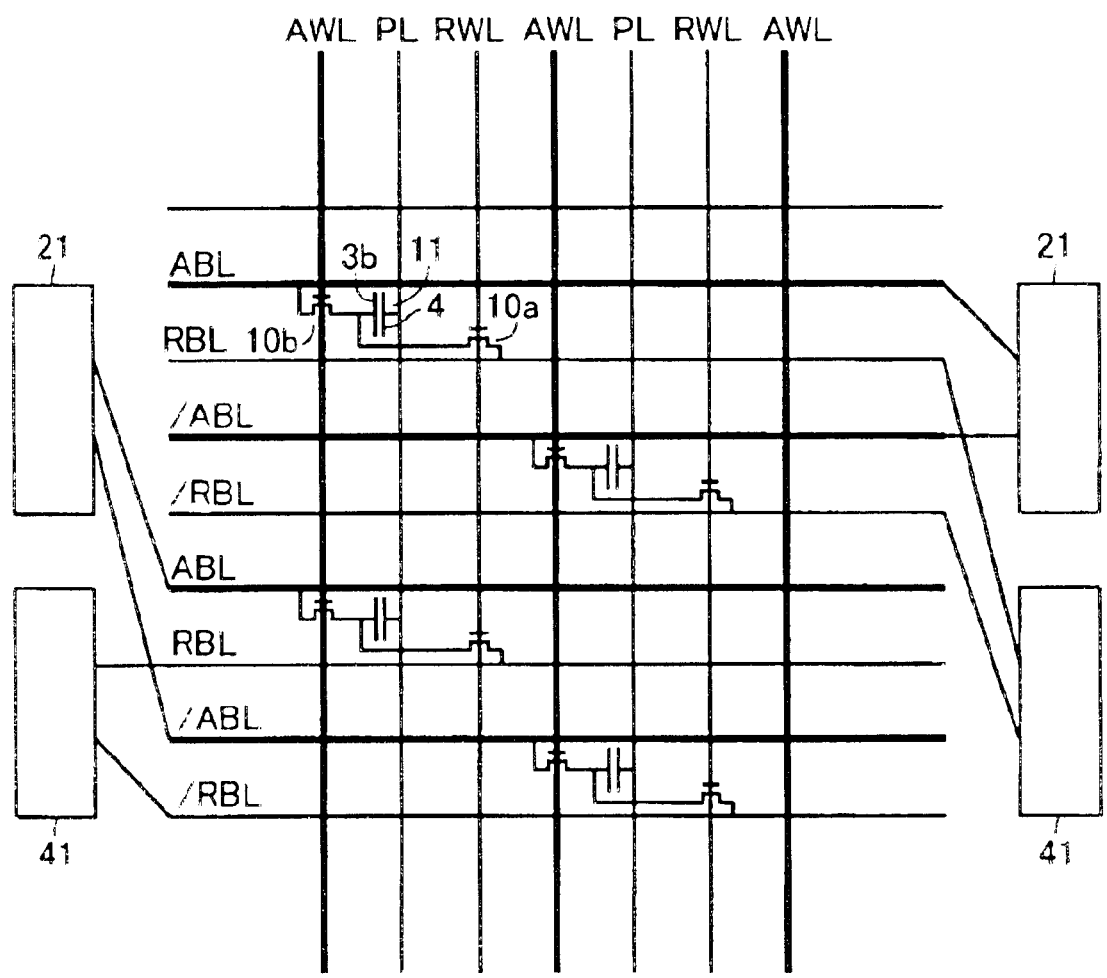
FIG. 17 is an interconnection diagram showing an arrangement of sense amplifiers for achieving a background refresh system of the DRAM in FIG. 14.

FIG. 17 shows connection between the bit lines and the sense amplifiers in the memory cell array of this embodiment. Access word line AWL, refresh word line RWL and plate electrode PL connected to the cell plate are formed of the gate electrode layers at the same level, as shown in FIG. 16. When the access word line AWL is activated, the access sense amplifier is activated. When refresh word line RWL is activated, the refresh sense amplifier 41 is activated.

As described above, the refresh can be independently executed in the operation of the memory cells other than the access for write and read. Thereby, the refresh can be executed independently of the normal access, and the efficiency of access to the DRAM can be improved.

As described above, the two transistors in the memory cell of the two-transistor and one-capacitor type are independently provided for the access and the refresh, respectively, and description will now be given on arbitration in the above structure. When the normal access to the same row address is performed, the operation depends on whether it is performed before the ACT (word line activation) operation or not. If the different row addresses are used, the operations are performed independently, and the arbitration is not required.

(1) In the case where the refresh request is issued before the ACT operation (FIG. 18), the operation for the normal access is assisted by activation of the word line (WL) and refresh word line (RWL) in response to the refresh request (REF) as well as activation of sense amplifier (SA) and refresh sense amplifier (RSA). Therefore, the read and write can be performed without delay.

(2) In the case where the refresh request is issued simultaneously with or after the ACT operation (FIG. 19), the operation for the normal access is performed with priority, and the operation in response to the refresh request is deemed as that the refresh is performed. Therefore, as shown in FIG. 19, the refresh request according to this timing is taken into the actual access, and is cancelled.

Figure 18:
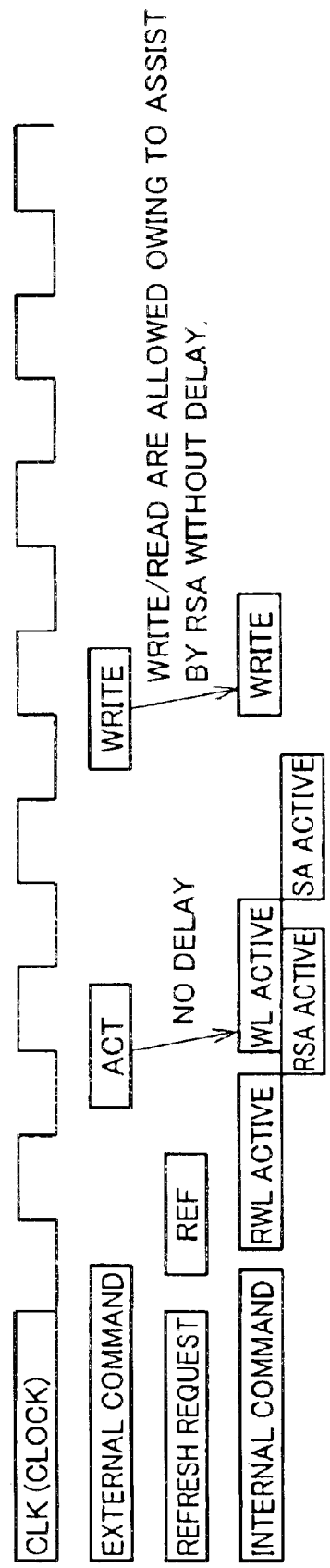
FIG. 18 shows arbitration between the normal access and the refresh (in the case where a refresh request is issued before an ACT operation) in the second embodiment of the invention.
Figure 19:
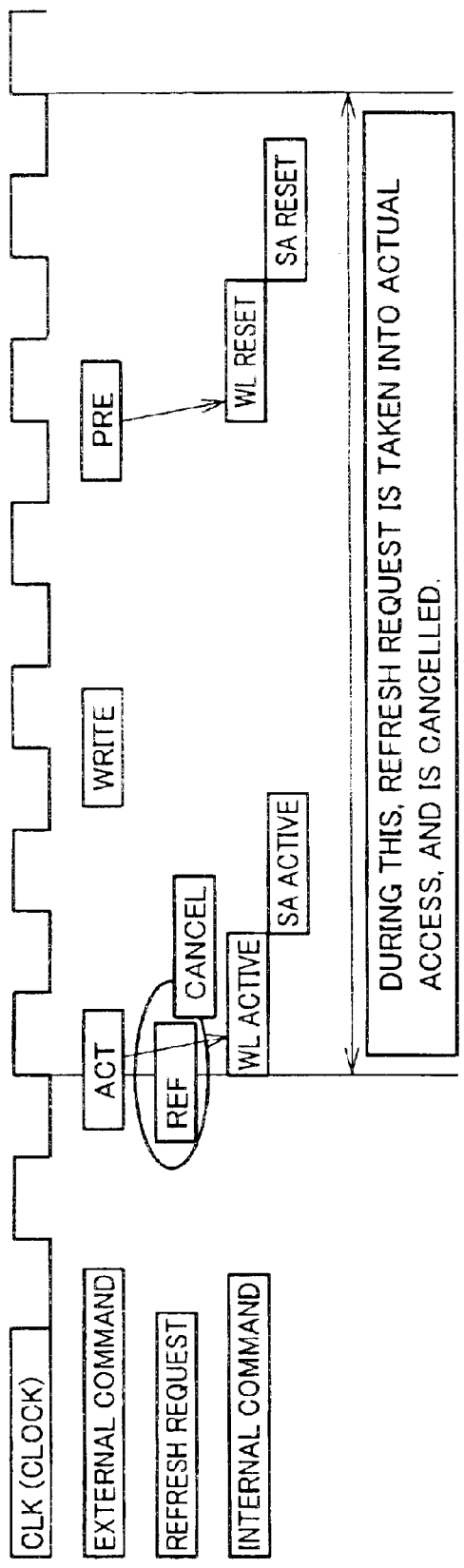
FIG. 19 shows arbitration between the normal access and the refresh (in the case where a refresh request is issued simultaneously with or after the ACT operation) in the second embodiment of the invention.

As shown in FIGS. 18 and 19, the refresh request is not perceptibly performed, and the refresh is performed together with execution of the normal access. The operations in this manner may also be referred to as "background refresh". As described above, the different transistors in the memory cell are used for the normal access and the refresh, respectively, whereby the background refresh can be easily and appropriately executed.

Figure 20:
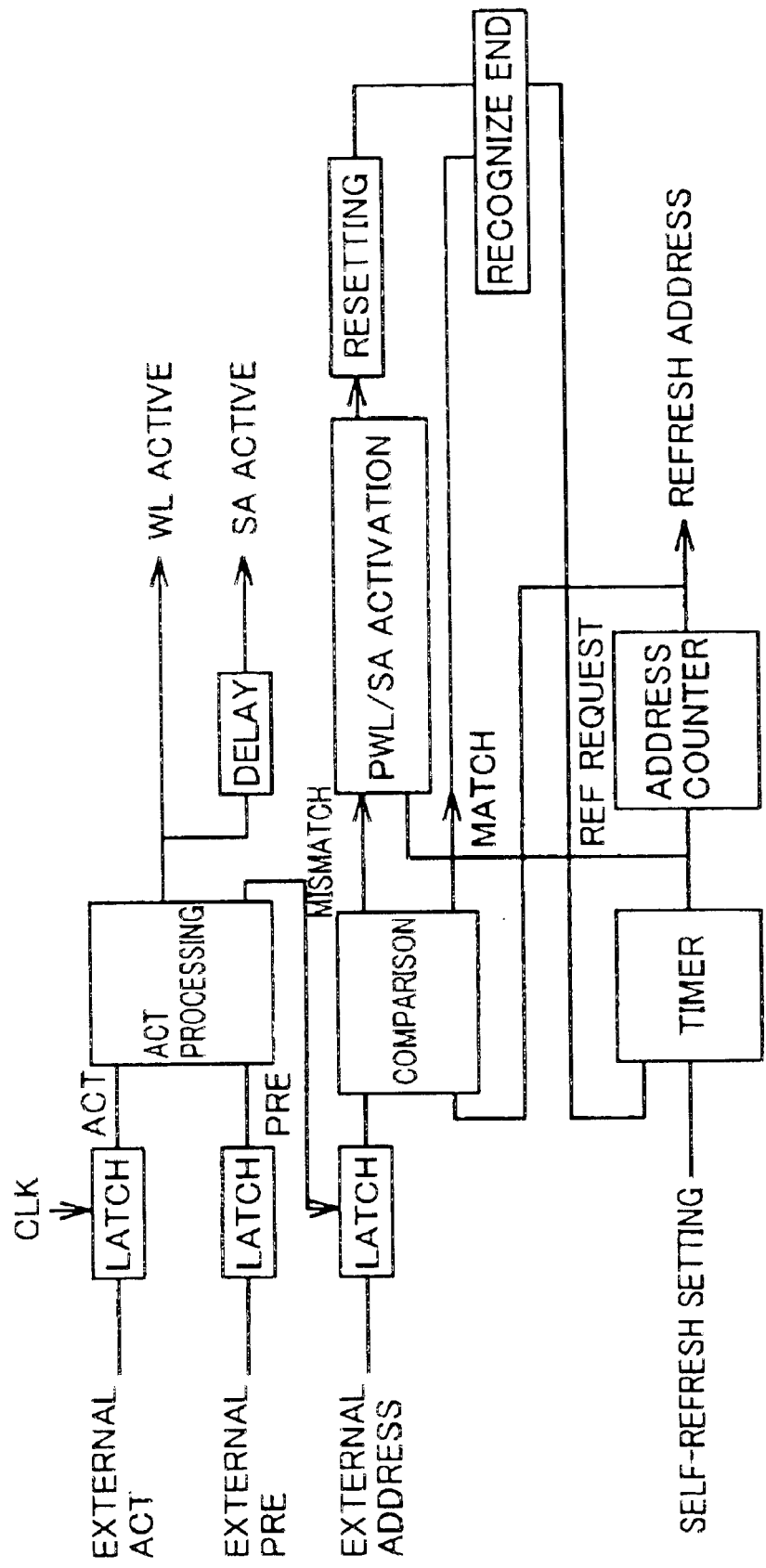
FIG. 20 shows an example of a circuit structure of arbiter achieving the arbitration shown in FIGS. 18 and 19.

FIG. 20 shows an example of a circuit structure of an arbiter for executing the arbitration described above. This circuit structure performs the following operations.

(1) In the case where the refresh request (REF) is issued before the ACT, the address for the ACT is not latched, and the matching of the refresh address does not occur. Therefore, the refresh operation is performed.

(2a) In the case where the refresh request is issued after the ACT, the refresh operation is performed if the latched address for the ACT is different from the refresh address. Since these are different from each other, the independent operations are performed, and the arbitration is not required.

(2b) In the case where the refresh request is issued after the ACT, the refresh operation is skipped if the latched address for the ACT matches with the refresh address.

Owing to the above circuit structure, the arbitration shown in FIGS. 18 and 19 is reliably performed.

Third Embodiment

Figure 21:
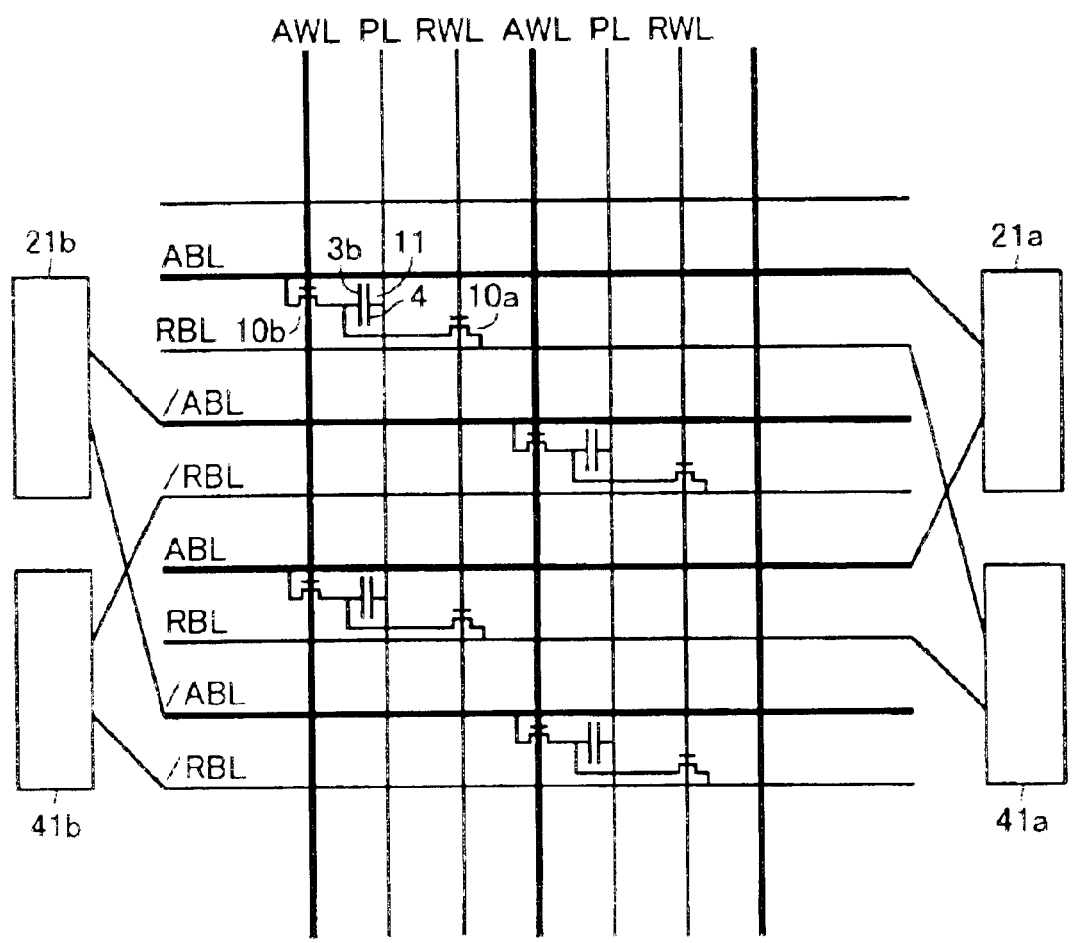
FIG. 21 shows a connection relationship between bit lines and sense amplifiers in a DRAM of a complementary capacity type of a third embodiment of the invention.

FIG. 21 shows a connection structure of sense amplifiers in a DRAM of the complementary capacity type of a third embodiment of the invention. The memory cell is of the two-transistor and one-capacitor type, and is the same as that of the second embodiment. However, the DRAM of this embodiment is of the complementary capacity type. Therefore, the two memory cells of the two-transistor and one-capacitor type in the second embodiment are coupled together to form one memory cell pair of this embodiment. Further, one of the transistors is used for the normal access, and the other is used for the refresh. This structure is the same as that in the arrangement of the second embodiment.

In the DRAM of the complementary capacity type described above, two memory cells are used for writing H-data and L-data, respectively. For this, the sense amplifiers and the bit lines are connected in such a manner that one access sense amplifier is connected to two access bit lines or two complementary access bit lines. Further, one refresh sense amplifier is connected to two refresh bit lines or two complementary refresh bit lines.

In FIG. 21, for activating the access sense amplifiers on the opposite sides, two access word lines AWL are activated. For activating the sense amplifier column on only one side, one access word line AWL is activated.

The refresh sense amplifiers 41a, 41b are operated similarly. For activating the refresh sense amplifiers on the opposite sides, the two refresh word lines RWL are activated. For activating only the refresh sense amplifier column on one side, only one refresh word line RWL is activated.

Figure 22:
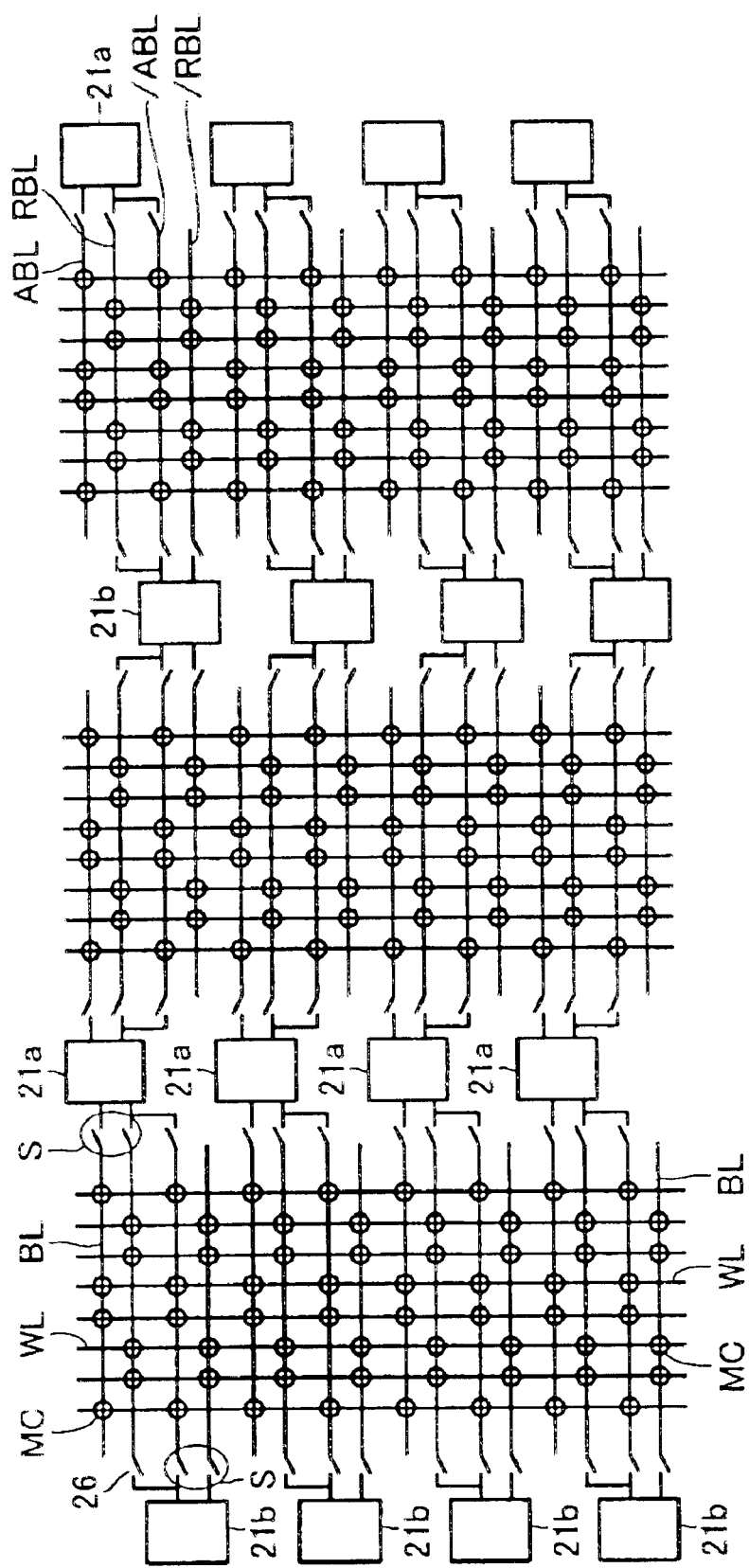
FIG. 22 shows a simplified memory cell array of the DRAM shown in FIG. 21.

FIG. 22 shows a simplified structure of the array. One connection switch, which is arranged on each of the opposite sides of the array provided with the bit lines, is added to the alternate-type arrangement. For operating only one of the memory cells of the two-transistor and one-capacitor type, the switch to be used is closed at a contact in a portion D. This is a basic combination.

For operating the memory cells of the two-transistor and one-capacitor type in the complementary manner, the two memory cells, which are selected by one access word line AWL, form the pair, and operate to write H-data and L-data therein, respectively. Therefore, depending on the writing of the H- and L-data, the connection between the bit lines and the sense amplifier is switched by the foregoing connection switches. Among the three connection switches connected to one sense amplifier, the connection switch, which is not used for the operation as the memory cell of the one-transistor and one-capacitor type, is used. Thereby, the above switching can be performed.

Although the description has been given on only the access side, switching on the refresh side can be performed similarly by using the connection switch.

FIGS. 23–26 show the complementary capacity operation mode of the memory cells of the two-transistor and one-capacitor type, and particularly, show the switching of the connection switches (sense amplifier connection controller or switching control circuit) in greater detail. Referring to these figures, description will now be given on only the access side of the memory cells of the two-transistor and one-capacitor type. However, similar structures are employed on the refresh side, although such structures will not be described.

Figure 23:
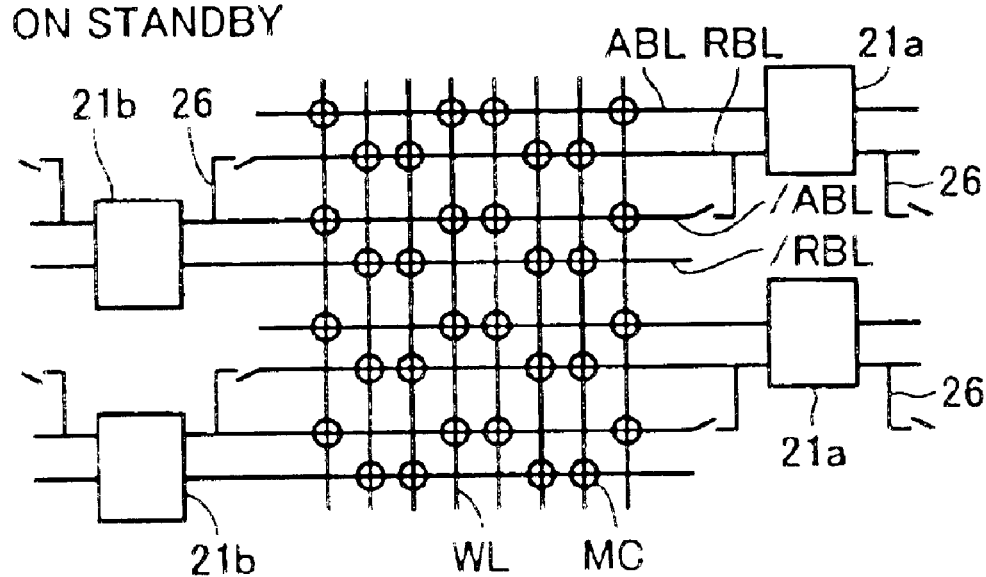
FIG. 23 shows the DRAM of the third embodiment of the invention, and particularly shows a state of connection, which is achieved between the sense amplifiers and the bit lines during standby when a switching control circuit selects a one-side capacity operation (normal arrangement) mode.
Figure 24:
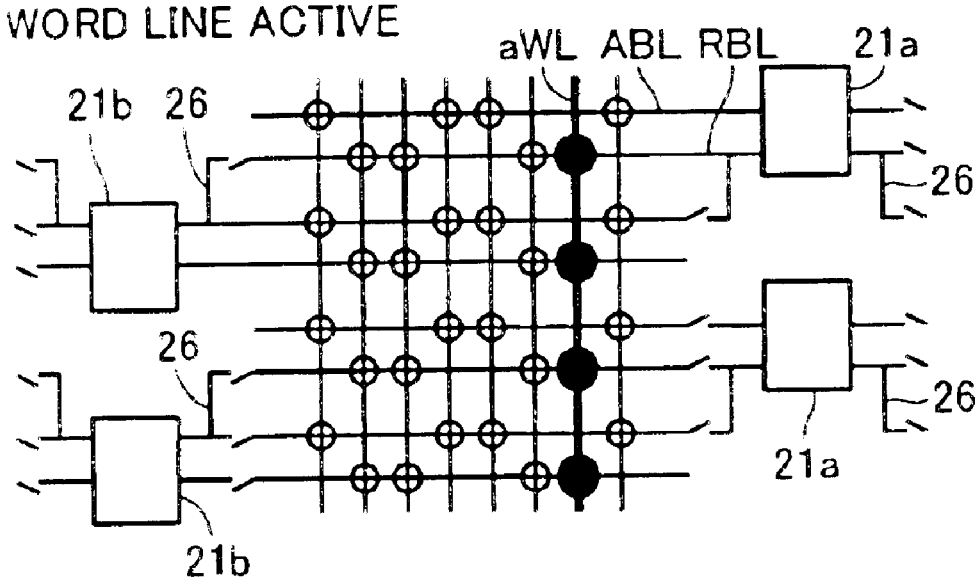
FIG. 24 shows connection achieved when word lines are activated in the one-side capacity operation mode.

FIG. 23 shows a state of the connection switches, which is attained when the memory cells of the two-transistor and one-capacitor type are on standby and in the one-side operation mode. Subsequent to this state, the word line of the memory cells of the two-transistor and one-capacitor type, which are in the one-side operation mode, is activated as shown in FIG. 24 so that one memory cell on each bit line pair is selected.

Figure 25:
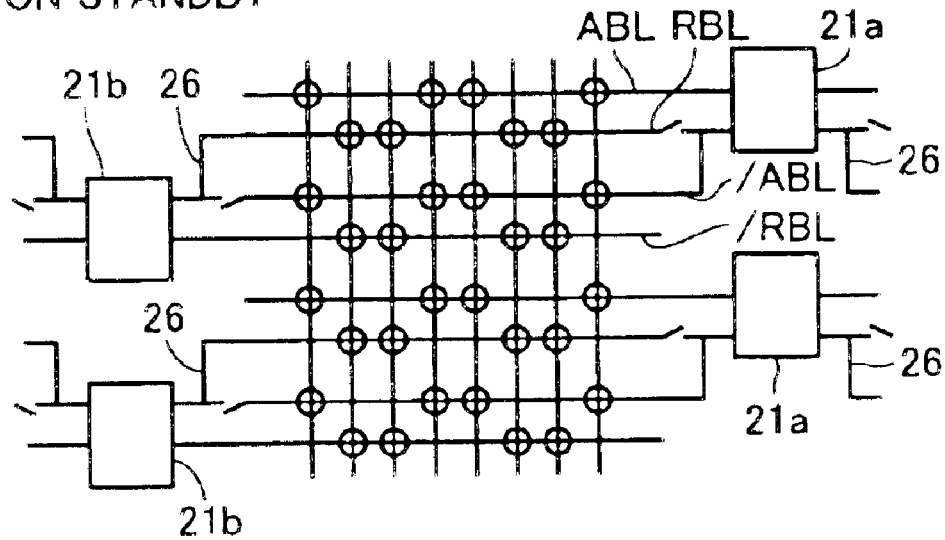
FIG. 25 shows the DRAM of the third embodiment of the invention, and particularly shows a state of connection, which is achieved between the sense amplifiers and the bit lines during standby when the switching control circuit selects a complementary capacity operation (complementary arrangement) mode.
Figure 26:
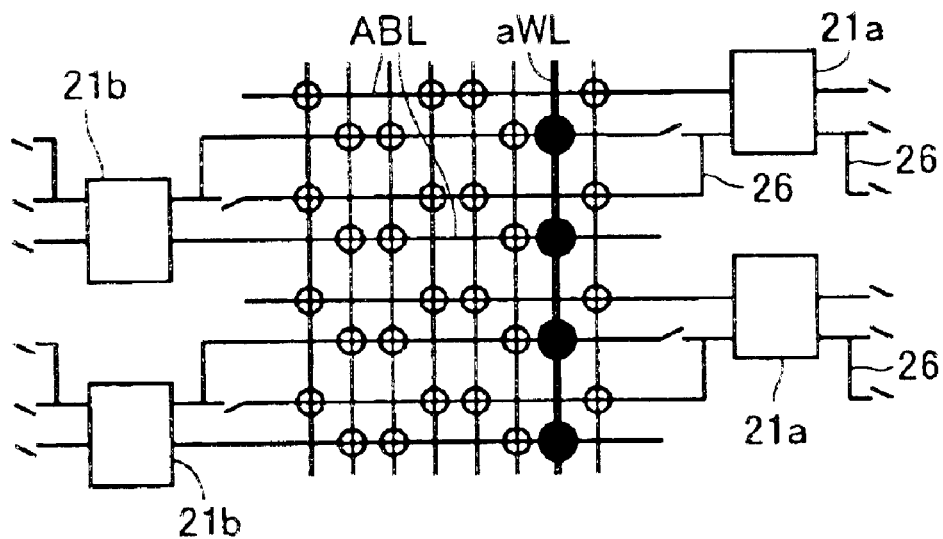
FIG. 26 shows connection achieved when word lines are activated in the complementary capacity operation mode.

When the device is on standby in the complementary operation mode of the memory cells of the two-transistor and one-capacitor type, the connection switches on the opposite sides of the shared sense amplifiers are closed for equalizing the bit lines, as shown in FIG. 25. However, the connection interconnections forming the pairs are different from those of the interconnection structure in the one-side operation mode.

When the word line is to be activated, the state of connection to the sense amplifier, which is connected to the memory cell selected by the selected word line in the selected block, is kept, and the connection to the others is released. The sense amplifiers connected to the bit lines, which are not connected to the selected memory cells in the selected block, maintain the non-operation state. Thereby, the selected bit lines and the unselected bit lines are located alternately so that the noises between the bit lines are significantly reduced, resulting in improvement of the operation margin.

Figure 27:
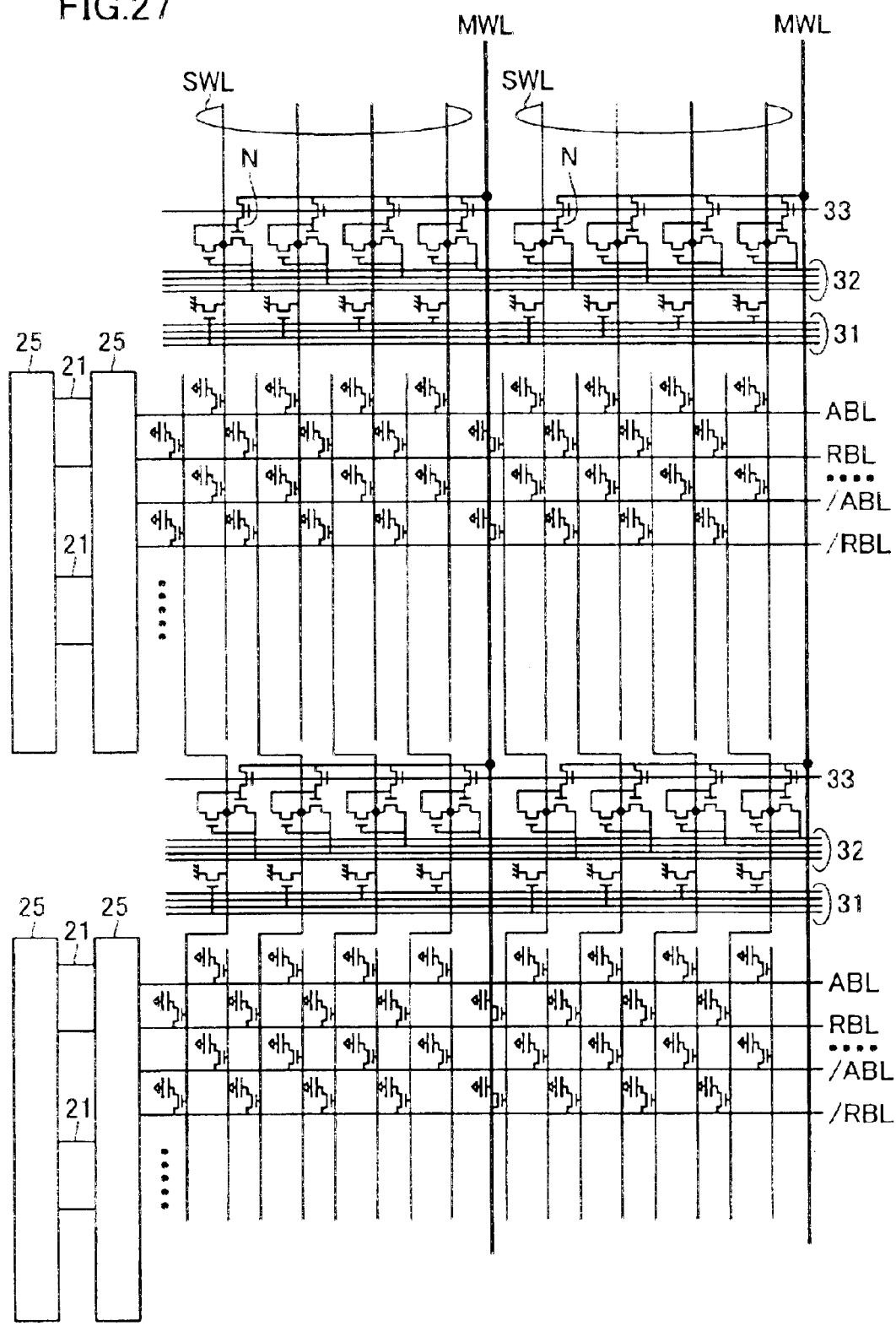
FIG. 27 shows structures of the word lines and bit lines in the DRAM of the third embodiment of the invention.

FIG. 27 shows the word lines and the bit lines in the structure described above. The word lines include the main word lines and the plurality of (e.g., four) sub-word lines to be selected by each main word line. In this example, the bit line has the complementary bit line structure, and connections to the bit line pairs are performed alternately on the opposite sides of each memory block. The sense amplifier connection controller (switching control circuit), which is a distinctive feature of the invention, is arranged between each sense amplifier and the bit line.

For selecting the sub-word line, the operation is performed without using a power supply of a voltage higher than power supply voltage Vcc, as described below. In this case, many operation forms or manners can be achieved as the normal operation forms of the DRAM of the two-transistor and one-capacitor type. For example, the following manners may be employed.

(A) In the case where a relatively high power supply voltage, i.e., a high potential power supply is applied, and the power supply voltage is higher than a set voltage for H-level writing in the memory cell, i.e., a low potential power supply, the operations are performed as follows.

(A1) First, the reset line is deactivated for selecting the main word line. The main word line thus selected is at the high power supply level.

(A2) Then, a bank select line is activated. The bank select line thus activated is likewise at the high power supply level. In this state, the potential on a node N is at the level of ((high power supply potential)—threshold).

(A3) Thereafter, a select line for selecting one sub-word line from the group of four sub-word lines is activated to attain a high power supply level, whereby the potential on node N rises to or above the high power supply level. Thereby, the level of the select line is sufficiently transmitted to the sub-word line to be selected, and the level thereon rises to an extent, which allows sufficient writing of the low power supply level into the memory cell.

(B) In the case where the high power supply level is not present, and only one low power supply level is present, the operations are performed as follows.

(B1) First, the reset line is deactivated to select the main word line. The main word line thus selected is at the low power supply level.

(B2) Then, the bank select line is activated. In this operation, if the bank select line remains at the low power supply level, the potential on node N is at the level of ((low power supply level)—threshold). Therefore, even if the select line is activated, the level on the sub-word line does not sufficiently rise so that the H-level writing in the memory cell cannot be performed sufficiently. In this case, therefore, a self-boost circuit is used for raising the level of the bank select line above the low power supply level, and the bank select line is closed to maintain the potential on node N after the low power supply level is sufficiently transmitted to node N.

(B3) Thereafter, the select line for selecting one sub-word line from the group including four is activated to attain a level higher than the low power supply level by the self-boost circuit, similarly to the foregoing operation. As a result, the potential on node N is raised to the high power supply level. Thereby, the level of the select line is sufficiently transmitted to the sub-word line to be selected, and the potential thereon sufficiently rises to the level for sufficiently writing the low power supply level into the memory cell.

In a structure modified into the DRAM of the two-transistor and one-capacitor type according to the invention, operations are performed as follows in the situations similar to those described above.

(C) In the case where a relatively high power supply, i.e., a high power supply potential is applied, and the power supply voltage is relatively higher than the set voltage (low power supply) for writing the H-level in the memory cell, operations are performed as follows.

(C1) First, the reset line is deactivated to select the main word line. The main word line thus selected is at the high power supply level.

(C2) Then, the bank select line is activated. The bank select line thus activated is at the high power supply level. In this state, node N is at the level of ((high power supply level)—threshold).

(C3) Thereafter, the select line for selecting the one sub-word line from the group including four is activated to attain the level of ((high power supply level)—threshold). As a result, the potential on node N rises to or above the high power supply level. Thereby, the potential on the select line rises to the level of ((high power supply level)—threshold) to allow reading from the L-written memory cell.

(C4) During the subsequent restoring operation for writing the H-level into the memory cell, the select line is activated to the high power supply level so that the potential on node N rises to or above the high power supply level. Thereby, the level of the select line rises to the high power supply level, and is sufficiently transmitted to the sub-word line to be selected so that the potential thereon rises to the level allowing sufficient writing of the low power supply level in the memory cell.

(D) In the case where the high power supply level is not present, and only one power supply level is present, operations are performed as follows.

(D1) First, the reset line is deactivated to select the main word line. The main word line thus selected is at the low power supply level.

(D2) Then, the bank select line is activated. In this state, if the bank select line remains at the low power supply level, the potential on node N attains the level of ((low power supply level)—threshold). Therefore, the level of the sub-word line does not sufficiently increase even if the select line is activated. Accordingly, H-level cannot be sufficiently written in the memory cell. In this case, therefore, the self-boost circuit is used to increase the level of the bank select line above the low power supply level, and the low power supply level is sufficiently transmitted to node N. Thereafter, the bank select line is closed for holding the potential on node N.

(D3) Thereafter, the potential on the select line for selecting one sub-word line from the group including four is raised to the low power supply level, similarly to the foregoing case, so that the potential on the sub-word line is raised to the low power supply level. As a result, the reading from the L-written memory cell is allowed.

(D4) During the subsequent restoring operation for writing the H-level in the memory cell, the select line is activated to attain the level higher than the low power supply level by the self-boost circuit. As a result, the potential on nose N is further raised to the higher power supply level. Thereby, the level of the select line is sufficiently transmitted to the sub-word line to be selected, and the potential thereon rises to the level allowing sufficient writing of the low power supply level in the memory cell.

Figure 28:
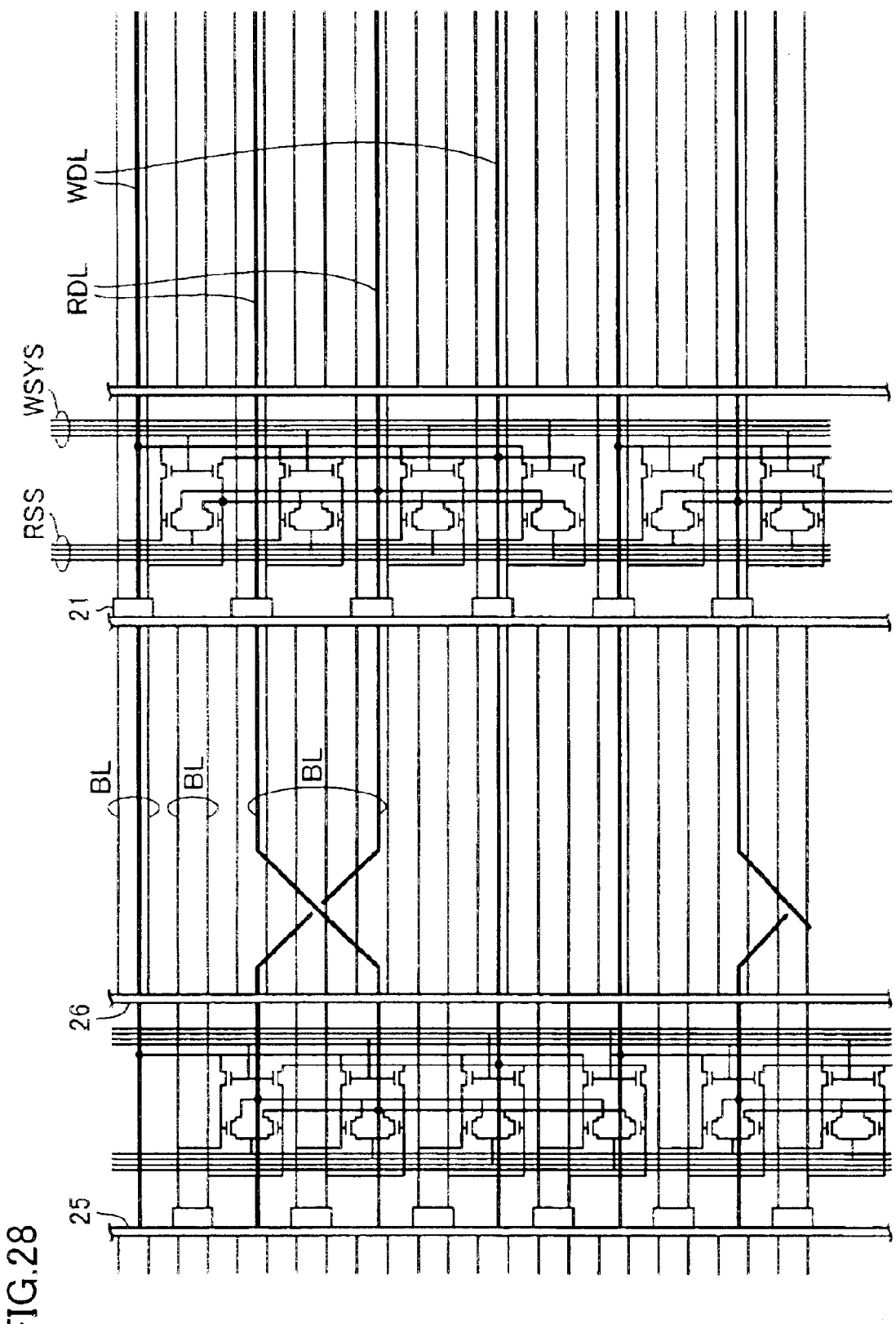
FIG. 28 shows a structure on the bit line side of the DRAM of the third embodiment of the invention.

FIG. 28 shows a structure on the bit line side. The bit line pairs are alternately connected to the sense amplifiers on the opposite sides of the memory block. When the operation as the complementary DRAM of the two-transistor and one-capacitor type is to be performed instead of the normal operation as the DRAM of the two-transistor and one-capacitor type, the connections are changed in accordance with the operation mode. The control of the connection depending on the operation mode is performed by the sense amplifier connection controller (switch control circuit).

Fourth Embodiment

Figure 29:
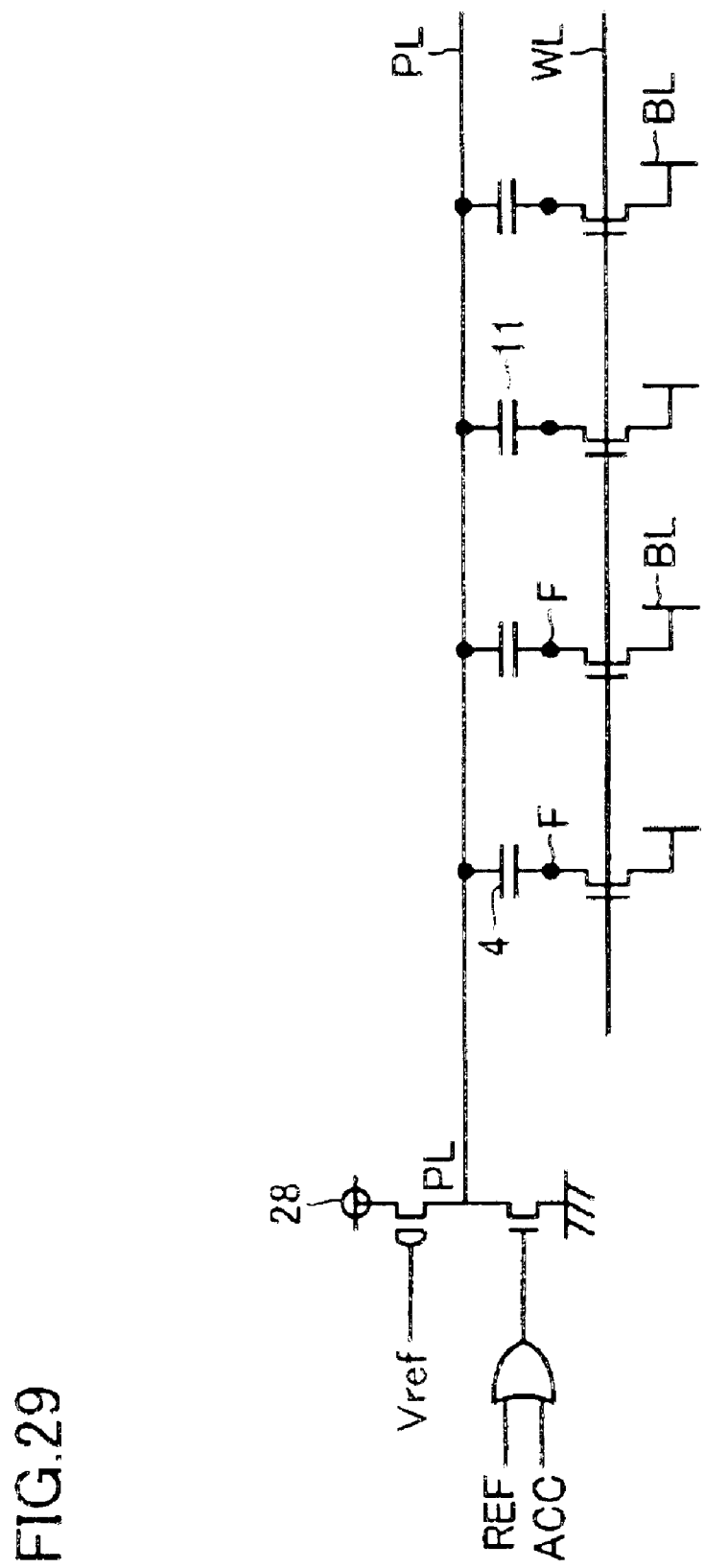
FIG. 29 shows a structure of a cell plate line drive in a DRAM of a fourth embodiment of the invention.

FIG. 29 shows compensation for the potential on the cell plate in the memory array of a fourth embodiment of the invention. The cell plate is the opposed electrode with respect to the storage node. By controlling the potential on the cell plate, it is possible to reduce the charge loss of the H-data stored on the storage node. In the structure shown in FIG. 29, the H-data on the storage node leaks onto the substrate so that the amount of charges stored on the storage node decreases with time.

In the operation, the potential on the cell plate may be changed oppositely to the change causing the loss of H-data, and thus may be changed from L-level toward H-level, whereby it is possible to compensate for loss of the H-data by the coupling effect achieved by the capacitance between the cell plate and the storage node. Then, description will now be given on potential drive of a cell plate line PL.

First, the word line is activated to renew the data in the memory cell, and the cell plate potential is reset to Level. Thereafter, the potential on the cell plate rises owing to charging with a minute current, which flows from a pMOS transistor side of a cell plate drive 28 having the pMOS transistor and an nMOS transistor. In this operation, the potential on a storage node F, which forms an opposite electrode of the cell plate of the memory cell capacitor, rises owing to the coupling. Accordingly, the reduction in H-data of the capacitor due to the leak is cancelled with the increase owing to the coupling so that the memory cell data can be stably held for a long time.

Figure 30:
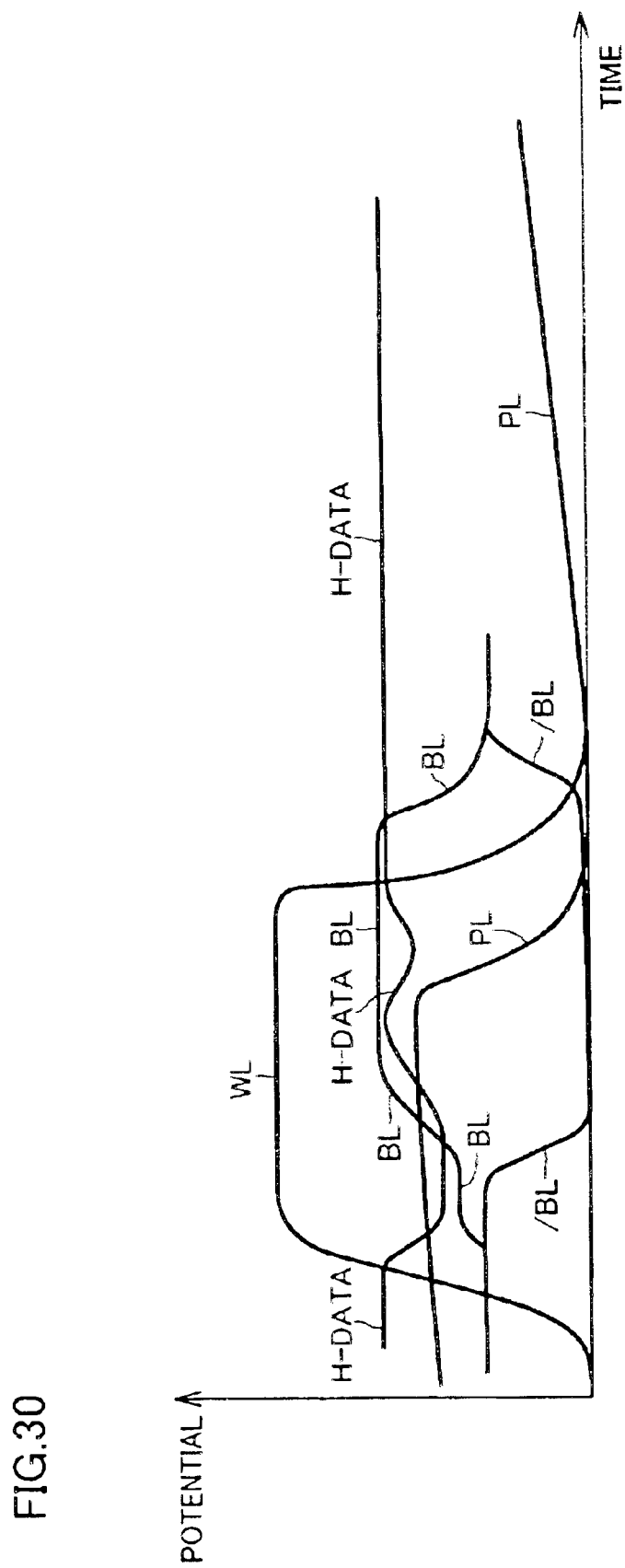
FIG. 30 shows changes in potentials of respective portions of the cell plate line.
Figure 31:
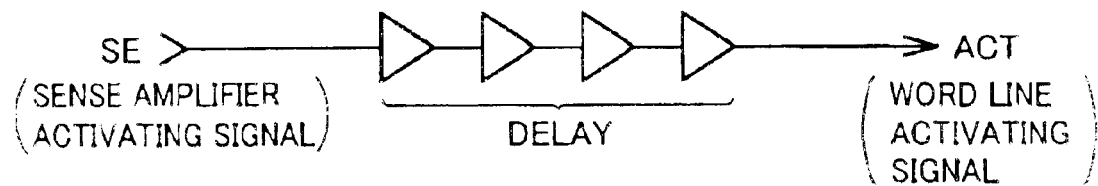
FIG. 31 shows a relationship between a sense amplifier activating signal and an ACT signal.

FIG. 30 shows change in potentials on various portions with time. The cell plate is actually reset after the word line is activated, the data is read from the memory cell and is amplified, and renewal of the memory cell data is guaranteed. Accordingly, the ACT signal applied to the nMOS side of the cell plate driver 28 is issued for performing the reset when a predetermined time elapses after sense amplifier activating signal.

Owing to the above structure, cell plate line driver 28 is arranged, and is charged with a minute current flowing from the pMOS transistor thereof, whereby compensation for the charge leak of H-data from the capacitor can be performed, and the data can be held stably for a long time.

Figure 32:
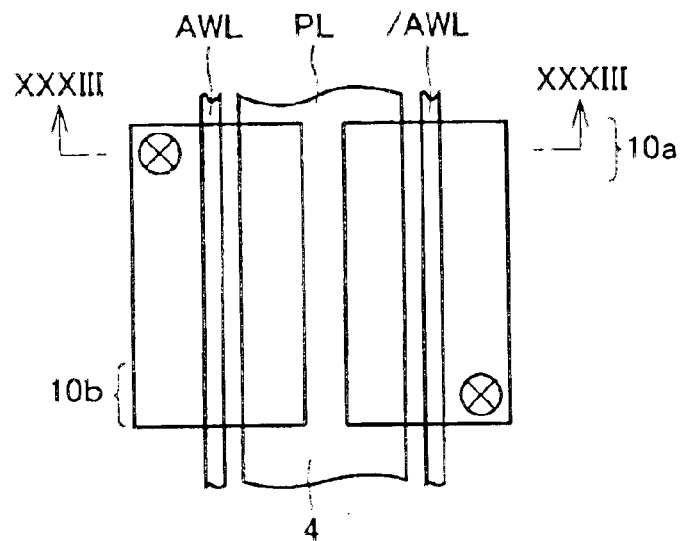
FIG. 32 shows a structure of the cell plate line drive in the DRAM of the fourth embodiment of the invention using memory cells of two-transistor and two-capacitor type.
Figure 33:
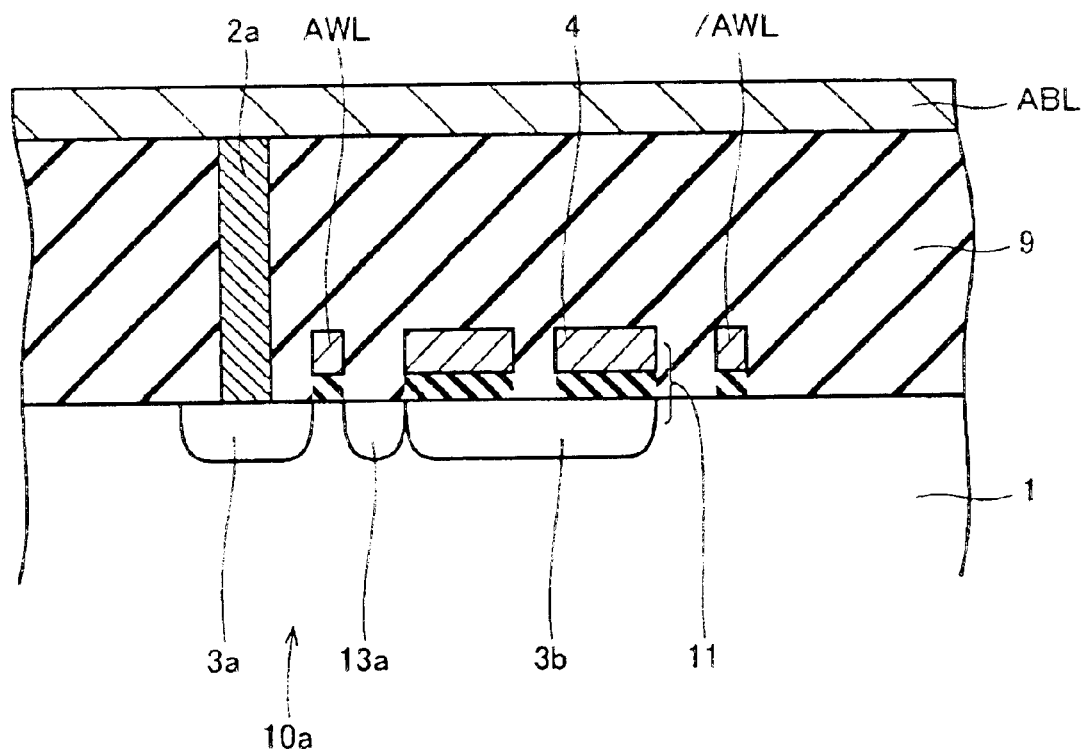
FIG. 33 is a cross section taken along line XXXIII—XXXIII in FIG. 32.
Figure 34:
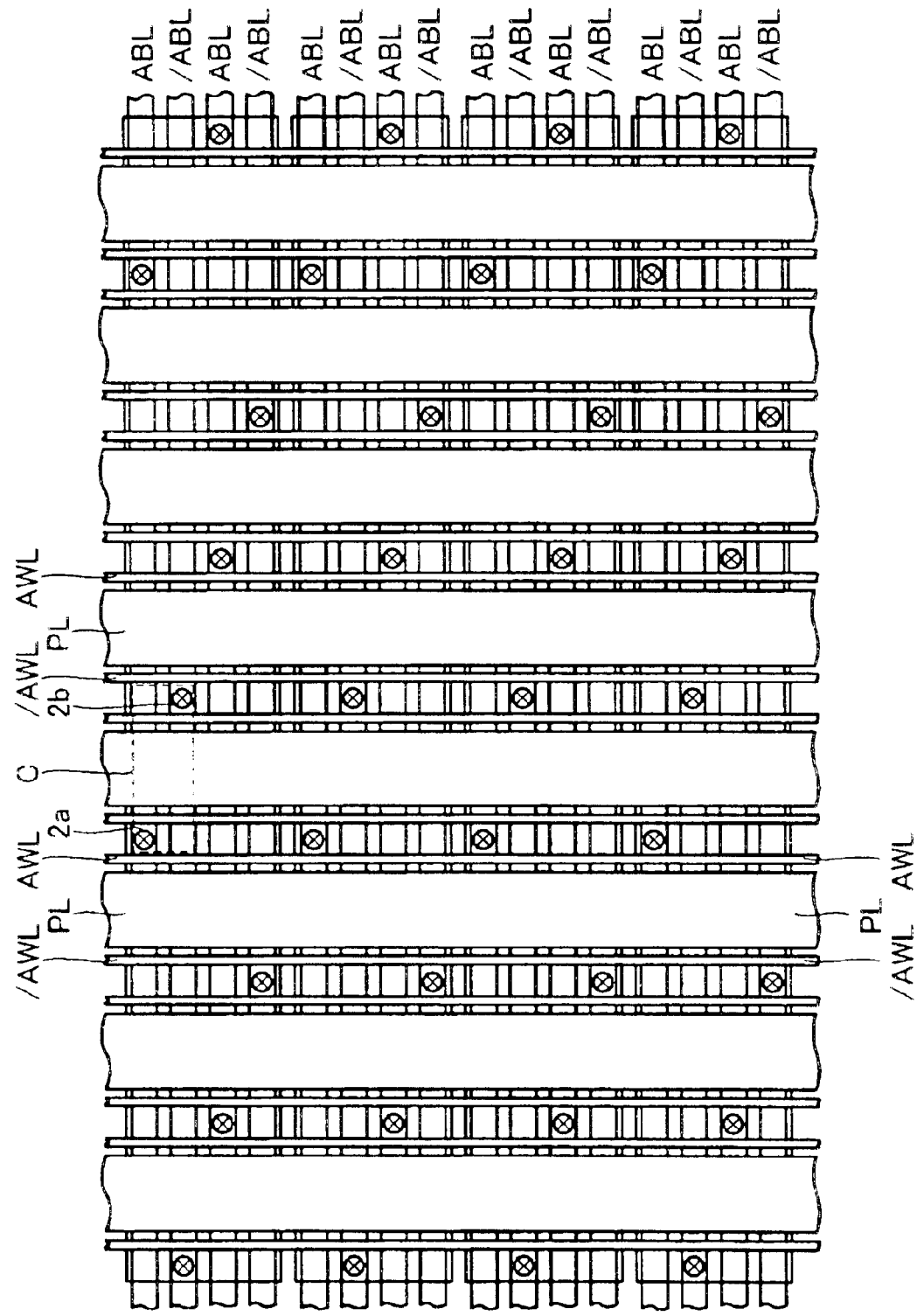
FIG. 34 shows an array arrangement using memory cells of the two-transistor and two-capacitor type in the fourth embodiment of the invention.

In the fourth embodiment described above, it is not essential that the memory cell combined with the cell plate potential changing circuit is formed of the two transistors and the one capacitor. Storage devices having various kinds of memory cells may be employed provided that the memory cell has the cell plate and at least one transistor. In the case of the memory cell, e.g., of two-transistor and two-capacitor type, the divided impurity regions (active layers) are connected to different access word lines WL (AWL), respectively, but the plate (PL) is commonly used, as shown in FIGS. 32 and 33. As can be seen from an array arrangement in FIG. 34, the memory cells controlled by complementary word lines AWL and /AWL are connected to lines ABL and /ABL. When the access is made in this state, data is simultaneously read out from the respective memory cells. Since H-data is essentially written in one or some of the memory cells, adaptation to this situation can be performed by changing the potential on the cell plate.

Although the present invention has been described and illustrated in detail, it is clearly understood that the same is by way of illustration and example only and is not to be taken by way of limitation. For example, the followings are contained in the scope of the invention.

(1) The memory cell combined with the cell plate potential changing circuit is not restricted to the structure of the two-transistor and one-capacitor type. The invention can be applied to various kinds of the storage devices having various kinds of memory cells provided that the memory cell has the cell plate and at least one transistor. For example, a memory cell of the two-transistor and two-capacitor type can be used.

(2) The memory cells of the DRAM of the background refresh type are not restricted to the memory cells of the two-transistor and one-capacitor type, which have been specifically described, but may be memory cells of the two-transistor and one-capacitor type other that above.

(3) Although description has been given on the structure, in which the memory cell structure is the nMOS structure, similar structures can be employed even in the case of the pMOS structure. In this case, control signals opposite to those for the nMOS are employed. Thus, the word line is at L-level when active, and the potential on the cell plate is at H-level when reset.

The spirit and scope of the present invention are limited only by the terms of the appended claims. Modifications, variations or equivalent arrangements within the scope of the attached claims should be considered to be within the scope of the invention.

What is claimed is:

1. A semiconductor memory device comprising:
   a memory cell array formed of a plurality of memory cells arranged in rows and columns, and each provided with first and second transistors having gate electrodes and impurity regions forming sources/drains as well as one capacitor, bit lines corresponding to said plurality of columns and word lines corresponding to said plurality of rows; and a sense amplifier connected to said bit lines and used for amplifying a signal for normal access to said memory cells and refresh, wherein said first transistor is arranged as a transistor for normal access to be used for the normal access and not to be used for the refresh access, said second transistor is arranged as a transistor for refresh to be used for the refresh access and not to be used for the normal access, and said semiconductor memory device employs a background refresh system for automatically refreshing said memory cell regardless of presence and absence of a refresh signal when said access sense amplifier is operating.

2. The semiconductor memory device according to claim 1, wherein said bit lines are formed of an access bit line and a refresh bit line, said first transistor is connected to said access bit line, and said second transistor is connected to said refresh bit line.

3. The semiconductor memory device according to claim 1, wherein said word lines are formed of an access word line and a refresh word line, said sense amplifier comprising an access sense amplifier to be activated via said access word line and a refresh sense amplifier to be activated via said refresh word line, and said access sense amplifier and said refresh sense amplifier operate independently of each other.

4. A semiconductor memory device comprising:

a memory cell array formed of a plurality of memory cells arranged in rows and columns, and each provided with first and second transistors having gate electrodes and impurity regions forming sources/drains as well as one capacitor, bit lines corresponding to said plurality of columns and word lines corresponding to said plurality of rows;

switching control means for eliminating a complementary relationship between said memory cell and said complementary memory cell, establishing an equivalent relationship between said memory cell and said complementary memory cell, and operating both the memory cells equivalently, and a sense amplifier connected to said bit lines and used for amplifying a signal for access to said memory cells and refresh, wherein said memory cells are paired with complementary memory cells, respectively, and said sense amplifiers are formed of a normal sense amplifier connected to said bit line coupled to said memory cell and a complementary sense amplifier connected to a complementary bit line coupled to said complementary memory cell.

5. The semiconductor memory device according to claim 4, wherein said word lines are formed of a first word line connected to said memory cell and a second word line connected to said complementary memory cell.

6. The semiconductor memory device according to claim 5, wherein at least one of said first and second word lines is activated to activate at least one of said sense amplifier and said complementary sense amplifier.

7. The semiconductor memory device according to claim 4, wherein one of the transistors in said memory cell is arranged as a transistor for normal access, the other transistor is arranged as a transistor for refresh, one of the transistors in said complementary memory cell is arranged as a transistor for normal access, and the other in said complementary memory cell is arranged as a transistor for refresh.

8. The semiconductor memory device according to claim 7, wherein said bit lines are formed of an access bit line and a refresh bit line, said word lines are formed of an access word line and a refresh word line, said sense amplifiers are formed of an access sense amplifier and a refresh sense amplifier, said normal access transistor in the memory cell is connected to said access bit line, said refresh transistor in the memory cell is connected to said refresh bit line, said normal access transistor in the complementary memory cell is connected to said complementary access bit line, and said refresh transistor in the complementary memory cell is connected to said complementary refresh bit line.

9. The semiconductor memory device according to claim 4, wherein said switching control means includes sense amplifier connection control means for eliminating said complementary relationship by changing the state of connection of said sense amplifier only to said normal bit line to the state of connection to said normal and complementary bit lines, and changing the state of connection of said complementary sense amplifier only to said complementary bit line to the state of connection to said access bit line and said complementary access bit line different from said normal bit line and said complementary bit line.

10. A semiconductor memory device comprising:

a memory array provided with memory cells arranged in rows and columns, and each including at least one transistor having a gate electrode and impurity regions forming source/drain as well as one capacitor, bit lines corresponding to the plurality of columns and word lines corresponding to the plurality of rows:

a cell plate forming one of electrodes of said capacitor and using said impurity region as an opposite electrode; and cell plate potential changing means for changing the potential on the cell plates, wherein said cell plate potential changing means is time-varying potential changing means for correcting the potential on said cell plate varying with time due to leak of potentials in said capacitor.

11. The semiconductor memory device according to claim 10, wherein said cell plate is arranged for each of said word lines.

12. The semiconductor memory device according to claim 11, wherein said cell plate has a belt-like form extending along said word line, and said memory array is positioned along said belt-like cell plate.

13. The semiconductor memory device according to claim 10, wherein said cell plate potential changing means can reset an amount of change effected on said cell plate when accessing the memory cell.

14. The semiconductor memory device according to claim 10, wherein said cell plate potential changing means changes the potential on said cell plate by flowing a current through said capacitor.

* * * * *